(12) United States Patent
Cheng et al.

(10) Patent No.: US 12,133,432 B2
(45) Date of Patent: Oct. 29, 2024

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yudiao Cheng, Beijing (CN); Binyan Wang, Beijing (CN); Yue Long, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 461 days.

(21) Appl. No.: 17/629,106

(22) PCT Filed: Apr. 30, 2021

(86) PCT No.: PCT/CN2021/091475
§ 371 (c)(1),
(2) Date: Jan. 21, 2022

(87) PCT Pub. No.: WO2022/226996
PCT Pub. Date: Nov. 3, 2022

(65) Prior Publication Data
US 2023/0320145 A1    Oct. 5, 2023

(51) Int. Cl.
*H10K 59/131*    (2023.01)
*G09G 3/3258*    (2016.01)
*H10K 59/88*    (2023.01)

(52) U.S. Cl.
CPC ......... *H10K 59/131* (2023.02); *G09G 3/3258* (2013.01); *H10K 59/88* (2023.02);
(Continued)

(58) Field of Classification Search
CPC .... H10K 59/131; H10K 59/88; G09G 3/3258; G09G 2300/0408; G09G 2300/0819; G09G 2300/0842; G09G 2320/0209
See application file for complete search history.

(56) References Cited

U.S. PATENT DOCUMENTS 10,431,579 B2    10/2019    Yang et al.
2018/0090061 A1    3/2018    Kim et al.
(Continued)

FOREIGN PATENT DOCUMENTS

CN    107871767 A    4/2018
CN    107942564 A    4/2018
(Continued)

OTHER PUBLICATIONS

International Search Report for Corresponding International Application No. PCT/CN2021/091475, dated Aug. 5, 2021.
Extended European Search Report for Corresponding EP Application No. 21938470.8, dated : Jan. 29, 2024. 8 pages.

*Primary Examiner* — Benjamin C Lee
*Assistant Examiner* — Nathan P Brittingham
(74) *Attorney, Agent, or Firm* — Leason Ellis LLP

(57) ABSTRACT

A display substrate and a display apparatus are provided. The display substrate includes a first display region and a second display region; the first display region is located at a periphery of the second display region; the first display region includes first light-emitting elements, first pixel circuits, second pixel circuits, and third pixel circuits; the second display region includes second light-emitting elements; the second pixel circuits are connected with the second light-emitting elements; the third pixel circuit is a (Continued)

dummy pixel circuit. The display substrate further includes first data lines and second data lines, the first data lines are configured to be connected with the first pixel circuits, and the second data lines are configured to be connected with at least the second pixel circuits. Part of the third pixel circuits overlap with the second data lines are insulated from the second data lines.

14 Claims, 11 Drawing Sheets

(52) U.S. Cl.
CPC ............... *G09G 2300/0408* (2013.01); *G09G 2300/0819* (2013.01); *G09G 2300/0842* (2013.01); *G09G 2320/0209* (2013.01)

(56) References Cited

U.S. PATENT DOCUMENTS

| | | |
|---|---|---|
| 2018/0204889 A1 | 7/2018 | Yu et al. |
| 2019/0265824 A1 | 8/2019 | Abe et al. |
| 2022/0069047 A1* | 3/2022 | Yang .................. H10K 59/88 |
| 2023/0354661 A1 | 11/2023 | Yang et al. |
| 2024/0049583 A1 | 2/2024 | An et al. |

FOREIGN PATENT DOCUMENTS

| | | |
|---|---|---|
| CN | 107993579 A | 5/2018 |
| CN | 110649080 A | 1/2020 |
| CN | 111916486 A | 11/2020 |
| KR | 20200066502 A | 6/2020 |

* cited by examiner

DISPLAY SUBSTRATE AND DISPLAY APPARATUS

CROSS-REFERENCE TO RELATED PATENT APPLICATIONS

This application is a U.S. National Stage Application under 35 U.S.C. § 371 of International Patent Application No. PCT/CN2021/091475 filed Apr. 30, 2021, which is incorporated by reference in its entirety.

TECHNICAL FIELD

At least one embodiment of the present disclosure relates to a display substrate and a display apparatus.

BACKGROUND

As people continue to pursue visual effects of display products, narrow frames and even full-screen display have become a new trend in development of current Organic Light-Emitting Diode (OLED) display products. A front camera is key to design of a full screen; in order to achieve a higher screen-to-body ratio, display products having screens such as notch screens and digging screens have emerged one after another; and these full-screen forms have increased the screen-to-body ratio by sacrificing appearance of mobile phones. As a result, design of a full display camera may not only ensure appearance of a mobile phone, but also increase the screen-to-body ratio.

SUMMARY

At least one embodiment of the present disclosure provides a display substrate and a display apparatus.

At least one embodiment of the present disclosure provides a display substrate, which includes a base substrate and a plurality of data lines on the base substrate. The display substrate includes a first display region and a second display region, the first display region is located at a periphery of the second display region; the first display region includes a plurality of first light-emitting elements, a plurality of first pixel circuits, a plurality of second pixel circuits, and a plurality of third pixel circuits; the plurality of first pixel circuits are connected with the plurality of first light-emitting elements in one-to-one correspondence; the second display region includes a plurality of second light-emitting elements; the plurality of second pixel circuits are connected with the plurality of second light-emitting elements in one-to-one correspondence; the third pixel circuit is a dummy pixel circuit; the plurality of data lines do not pass through the second display region, in which, the plurality of data lines include a plurality of first data lines and a plurality of second data lines, respective first data lines are configured to be connected with the first pixel circuits, and respective second data lines are configured to be connected with at least the second pixel circuits. In a direction perpendicular to the base substrate, part of the plurality of third pixel circuits overlap with the plurality of second data lines, and at least part of the third pixel circuits overlapping with the second data lines are insulated from the second data lines.

For example, according to an embodiment of the present disclosure, respective third pixel circuits overlapping with the second data line are insulated from the second data lines.

For example, according to an embodiment of the present disclosure, the respective first data lines extend along a first direction; the first data line of which an extension line does not pass through the second display region among the plurality of first data lines is configured to transmit a data signal to M first pixel circuits, the respective second data lines are configured to transmit signals to N pixel circuits, M≥N, and the N pixel circuits at least include the second pixel circuit.

For example, according to an embodiment of the present disclosure, the second data line includes a first sub-data line and a second sub-data line extending along the first direction, and an adapt line connecting the first sub-data line and the second sub-data line; the first sub-data line, the second sub-data line, and the first data line are arranged in a same layer; the first sub-data line is configured to be connected with the first pixel circuit; and the second sub-data line is configured to be connected with the second pixel circuit.

For example, according to an embodiment of the present disclosure, the display substrate further includes: a plurality of wirings, extending along the first direction and not passing through the second display region. The plurality of wirings and the plurality of first data lines are arranged in a same layer, and at least one data line is arranged between two adjacent wirings; and in the direction perpendicular to the base substrate, the wiring only overlaps with the third pixel circuit.

For example, according to an embodiment of the present disclosure, the plurality of wirings include a plurality of first wirings; the number of first wirings is equal to the number of second sub-data lines; and one of the first wirings and at least a portion of one second sub-data line are substantially located on a same straight line with space provided between them; an adapt region, including the plurality of adapt lines. The adapt region includes a first adapt region located on one side of the second display region in the first direction, the adapt line in the first adapt region extends along a second direction intersecting with the first direction and is located in a different layer from the first data line; the space is located on a side of the first adapt region away from the second display region; and the first wiring overlaps with at least part of the third pixel circuits.

For example, according to an embodiment of the present disclosure, the first wiring and the second sub-data line are configured to transmit different electrical signals.

For example, according to an embodiment of the present disclosure, the first wiring is configured to transmit a power voltage signal.

For example, according to an embodiment of the present disclosure, the adapt region further includes a second adapt region located on the other side of the second display region in the first direction; and the second adapt region is located in a non-display region other than the first display region and the second display region.

For example, according to an embodiment of the present disclosure, each of the adapt lines in the second adapt region includes a first adapt line and a second adapt line that are connected with each other and arranged in different layers; and one of the first adapt line and the second adapt line is connected with the second sub-data line and is located in a different layer from the second sub-data line.

For example, according to an embodiment of the present disclosure, in the second data line, two first sub-data lines are connected with a same second sub-data line; the two first sub-data lines are respectively located on both sides of the second display region in the first direction; and at least portions of the two first sub-data lines are substantially located on a same straight line.

For example, according to an embodiment of the present disclosure, one of the second sub-data lines extends along the first direction, and an orthographic projection of the one of the second sub-data lines overlaps with an orthographic projection of one of the wirings on a straight line extending along the first direction.

For example, according to an embodiment of the present disclosure, the adapt line is located in a non-display region other than the first display region and the second display region.

For example, according to an embodiment of the present disclosure, each adapt line includes a first adapt line and a second adapt line that are connected with each other and arranged in different layers; and one of the first adapt line and the second adapt line is connected with the second sub-data line and is located in a different layer from the second sub-data line.

For example, according to an embodiment of the present disclosure, a length of the second sub-data line is not less than a length of the first data line of which an extension line does not pass through the second display region among the plurality of first data lines.

For example, according to an embodiment of the present disclosure, one first sub-data line and one first data line are respectively located on both sides of the second display region in the first direction, and are substantially located on a same straight line; and the respective first sub-data lines and the first data lines located substantially on the same straight line are configured to transmit a same data signal.

For example, according to an embodiment of the present disclosure, the other of the first adapt line and the second adapt line extends in a second direction intersecting with the first direction, and is located in the same layer as the second sub-data line.

For example, according to an embodiment of the present disclosure, the second data line extends along the first direction; and the second data line is configured to be only connected with the second pixel circuit.

For example, according to an embodiment of the present disclosure, the plurality of pixel circuits included in the first display region are arranged in an array along the first direction and a second direction; and the plurality of second pixel circuits are located on both sides of the second display region in the second direction.

For example, according to an embodiment of the present disclosure, a pixel circuit column where the second pixel circuits arranged along the first direction are located includes the third pixel circuit; and the third pixel circuit in the pixel circuit column overlaps with the second data line.

For example, according to an embodiment of the present disclosure, the plurality of third pixel circuits include a plurality of third pixel circuit columns extending along the first direction and arranged along a second direction; and at least part of the plurality of third pixel circuit columns are located on at least one side of the second display region in the first direction.

For example, according to an embodiment of the present disclosure, the plurality of third pixel circuit columns further include portions located on both sides of the second display region in the second direction.

For example, according to an embodiment of the present disclosure, a pixel circuit includes a data writing transistor; the data writing transistor includes a first electrode, a second electrode and a gate electrode; an insulating layer is provided between a film layer where the first electrode of the data writing transistor is located and a film layer where the data line is located; first electrodes of data writing transistors in the first pixel circuit and the second pixel circuit are connected with the data line through a via hole located in the insulating layer; and first electrodes of data writing transistors in at least part of the third pixel circuits overlapping with the second data line are insulated from the second data line by the insulating layer.

At least one embodiment of the present disclosure provides a display substrate, which includes a base substrate; a plurality of pixel circuits and a plurality of data lines located on the base substrate. The plurality of pixel circuits include a plurality of first-type pixel circuits and a plurality of second-type pixel circuits; the first-type pixel circuits are electrically connected with the data line; and the second-type pixel circuits are insulated from the data line.

For example, according to an embodiment of the present disclosure, the first-type pixel circuit is electrically connected with the data line overlapping therewith; and the second-type pixel circuit is insulated from the data line overlapping therewith.

For example, according to an embodiment of the present disclosure, at least part of the first-type pixel circuits are configured to drive a light-emitting element connected therewith to emit light; and the second-type pixel circuit is a first dummy pixel circuit.

For example, according to an embodiment of the present disclosure, the first-type pixel circuits include a first pixel circuit and a second pixel circuit; the first pixel circuit overlaps with the light-emitting element connected therewith in a direction perpendicular to the base substrate; and the second pixel circuit does not overlap with the light-emitting element connected therewith in the direction perpendicular to the base substrate; the first-type pixel circuits further include a second dummy pixel circuit.

For example, according to an embodiment of the present disclosure, the second-type pixel circuits and part of the first-type pixel circuits are located in a same column.

For example, according to an embodiment of the present disclosure, the second-type pixel circuits and the second pixel circuits are located in a same column.

For example, according to an embodiment of the present disclosure, the pixel circuit includes a data writing transistor; the data writing transistor includes a first electrode, a second electrode, and a gate electrode; and an insulating layer is provided between a film layer where the first electrode of the data writing transistor is located and a film layer where the data line is located; first electrodes of data writing transistors of the first-type pixel circuits are connected with the corresponding data line through a via hole located in the insulating layer; and first electrodes of data writing transistors of the second-type pixel circuits are insulated from the data line by the insulating layer.

At least one embodiment of the present disclosure provides a display apparatus, including the display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

A Full Display Camera (FDC) refers to that a front camera is located at the bottom of a screen but does not affect a screen display function; and when the front camera is not used, the screen above the camera may still display images normally. From appearance point of view, the full display camera will not have any camera hole, which truly achieves a full-screen display effect.

Figure 1:
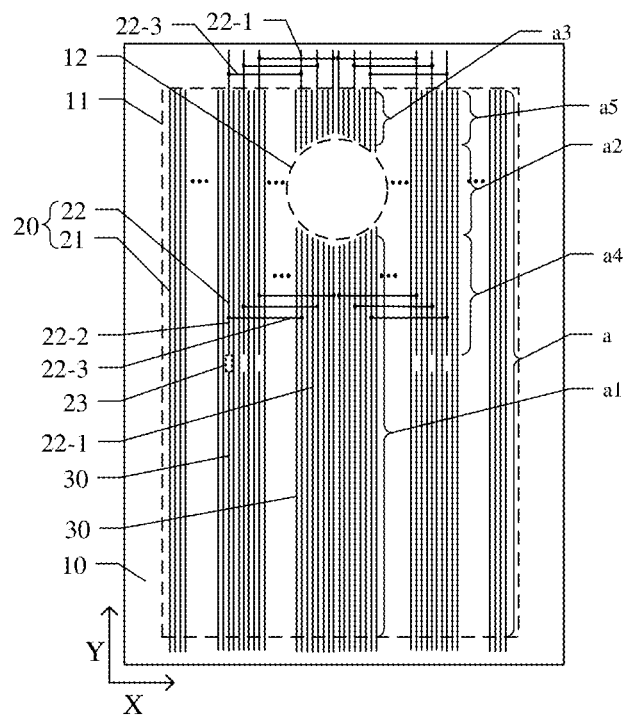
FIG. 1 is a partial planar structural schematic diagram of a display substrate in a display apparatus having a full display camera.

FIG. 1 is a partial planar structural schematic diagram of a display substrate in a display apparatus having a full display camera. As shown in FIG. 1, the display substrate includes a base substrate 10; and the display substrate includes a first display region 11 for normal display and a second display region 12 for providing a camera. The first display region 11 may be located on at least one side of the second display region 12. For example, the first display region 11 surrounds the second display region 12; the second display region 12 is a transparent display region, and the first display region 11 is an opaque display region only for display.

As shown in FIG. 1, the first display region 11 in the display substrate includes a first light-emitting element and a first pixel circuit that drives the first light-emitting element to emit light; the second display region 12 includes a second light-emitting element; a second pixel circuit that drives the second light-emitting element in the second display region 12 to emit light is located in the first display region to increase light transmittance of the second display region 12, that is, light transmittance of the second display region 12 is improved by separating the light-emitting element from the pixel circuit. For example, a plurality of second pixel circuits may be distributed at intervals among a plurality of first pixel circuits. For example, the second light-emitting element may be connected with the second pixel circuit through a transparent wiring. For example, the second display region 12 may be a hole region where no pixel circuit is provided in the entire display region. For example, densities of light-emitting elements provided in the first display region 11 and the second display region 12 may be the same or different.

As shown in FIG. 1, the display substrate includes a plurality of data lines 20 located on the base substrate 10. In a display apparatus having a full display camera, a plurality of data lines are arranged in two modes: winding inside the second display region and winding outside the second display region; because of limitation of a space size of the second display region, the display substrate shown in FIG. 1 is designed according to a fully compressed pixel circuit solution, and the data line is arranged by winding the data line outside the second display region 12. In the display substrate, the first display region includes a plurality of first pixel circuit columns and a plurality of second pixel circuit columns; in addition to the second pixel circuit, the second pixel circuit column in which the second pixel circuit is located further includes a dummy pixel circuit not connected with any light-emitting element; the first display region further includes a plurality of dummy pixel circuit columns; and at least one first pixel circuit column is arranged between two adjacent dummy pixel circuit columns. The above-described fully compressed pixel circuit refers to that the plurality of pixel circuit columns in the entire display region (including the first display region and the second display region) are compressed in an X direction without reducing pixel density of the entire display region (e.g., reducing a size of each pixel circuit in the X direction), to increase the number of pixel circuits arranged in the X direction; a newly added pixel circuit column includes a second pixel circuit column for connection with the second light-emitting element of the second display region, and a dummy pixel circuit column not connected with any light-emitting element.

As shown in FIG. 1, the plurality of data lines 20 include a data line 21 connected only with the first pixel circuit and a data line 22 connected with at least the second pixel circuit. The data line 21 is a data line extending in a Y direction. For example, the respective data lines 20 may adopt single-channel drive; and part of the data lines 20 are disconnected at an edge of the second display region 12, that is, part of the data lines 20 each includes two portions of data line 22-1 located on upper and lower sides of the second display region 12 respectively; the two portions of data line 22-1 are both connected with the first pixel circuit, and the two portions of data line 22-1 may implement electrical connection through an adapt line 22-3 and a data line 22-2 connected with the second pixel circuit, so that the two portions of data line 22-1 transmit the same data signal. Thus, the data line 22 includes, for example, five portions, which are sequentially the data line 22-1, the adapt line 22-3, the data line 22-2, the adapt line 22-3, and the data line 22-1. The numbers of first pixel circuits connected with the above-described two portions of data line 22-1 are respectively a1 and a3, and the numbers of second pixel circuits and dummy pixel circuits connected with the data line 22-2 are respectively a2 and (a4+a5), that is, the number of pixel circuits connected with the data line 22 is b, b=a1+a2+a3+a4+a5, where a1 to a5 represent the numbers of pixel circuits connected with the data line in corresponding positions in the diagram.

In study, an inventor of the present application finds that: an extension line of the data line 21 does not pass through the second display region 12; and the number of pixel circuits connected with the data line 21 is a (a=a1+a2+a3). In order to reduce data loading of the data line 22-2 connected with the second pixel circuit, a metal line where the data line 22-2 is located is disconnected into two portions on a side of the adapt line 22-3 away from the second display region 12; the metal line includes a data line 22-2 and a wiring 30; and a space 23 is provided between the data line 22-2 and the wiring 30 to implement insulation therebetween. The wiring 30 is connected with the dummy pixel circuit. In order to avoid floating of the wiring 30, the wiring 30 may be accessed to a power voltage signal (VDD). However, the number b of pixel circuits connected with the above-described data line 22 is greater than the number a of pixel circuits connected with the data line 21, which will cause data loading of the data line 22 to be too large, for example, when all the data lines input the same signal simultaneously (ET lighting), dark vertical stripes are prone to appear in a position of the second display region, which affects display quality of the display apparatus.

Embodiments of the present disclosure provide a display substrate and a display apparatus. The display substrate includes a base substrate and a plurality of data lines located on the base substrate. The display substrate includes a first display region and a second display region; the first display region is located at a periphery of the second display region; the first display region includes a plurality of first light-emitting elements, a plurality of first pixel circuits, a plurality of second pixel circuits, and a plurality of third pixel circuits; the plurality of first pixel circuits are connected with the plurality of first light-emitting elements in one-to-one correspondence; the second display region includes a plurality of second light-emitting elements; the plurality of second pixel circuits are connected with the plurality of second light-emitting elements in one-to-one correspondence; the third pixel circuit is a dummy pixel circuit; the plurality of data lines do not pass through the second display region; the plurality of data lines include a plurality of first data lines and a plurality of second data lines, respective first data lines are configured to be connected with only the first pixel circuits, and respective second data lines are configured to be connected with at least the second pixel circuits. Along a direction perpendicular to the base substrate, part of the plurality of third pixel circuits overlap with the plurality of second data lines, and at least part of the third pixel circuits overlapping with the second data lines are insulated from the second data lines. In the display substrate provided by the embodiment of the present disclosure, by arranging at least part of the third pixel circuits that overlap with the second data line to be disconnected from the second data line, the number of pixel circuits connected with the second data line may be reduced to reduce data loading, thereby alleviating the phenomenon of dark vertical stripes appearing in the second display region, and improving display quality of the display substrate.

Hereinafter, the display substrate and the display apparatus provided by the embodiments of the present disclosure will be described with reference to the accompanying drawings.

Figure 2:
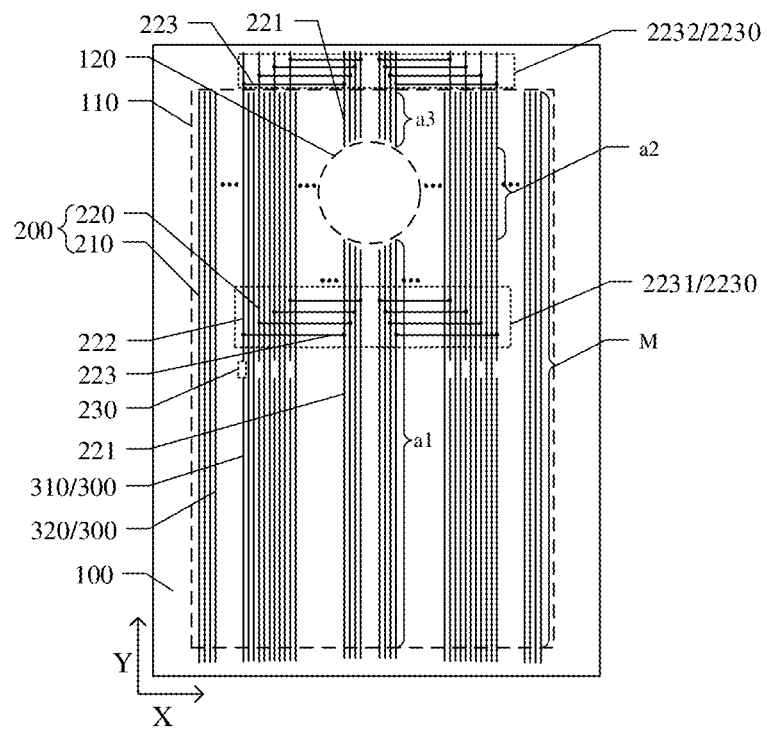
FIG. 2 is a partial planar structural schematic diagram of a display substrate provided by an example of an embodiment of the present disclosure.
Figure 3:
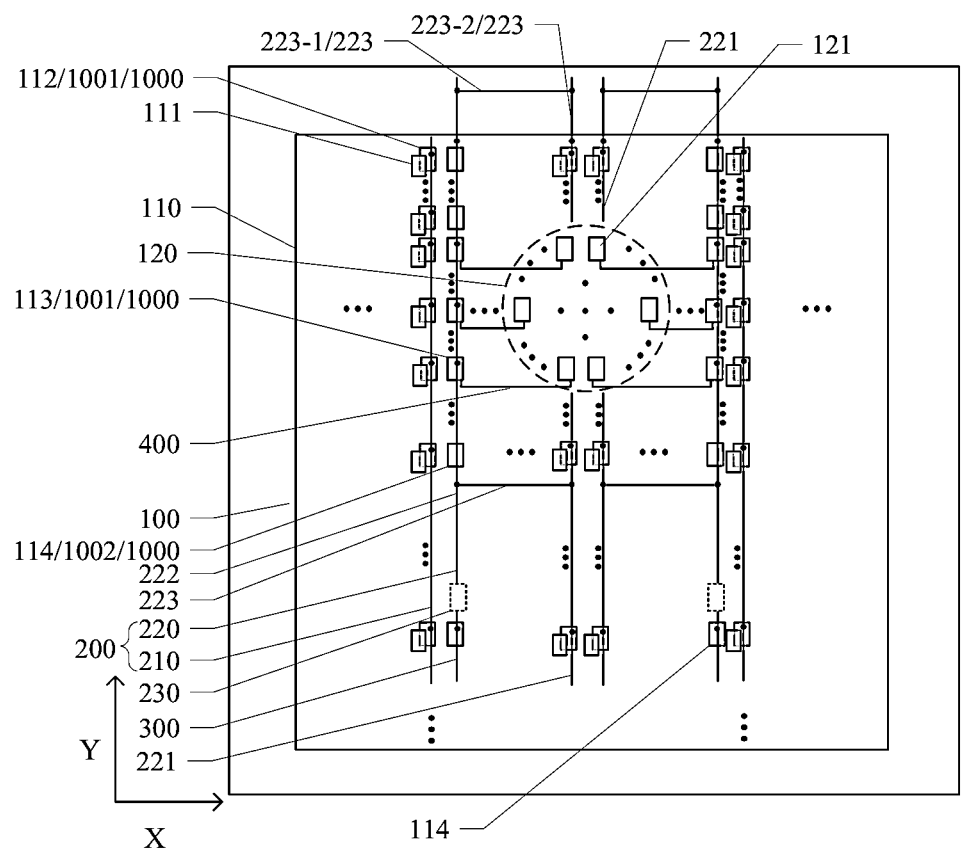
FIG. 3 is a partial enlarged structural schematic diagram of the display substrate shown in FIG. 2.

FIG. 2 is a partial planar structural schematic diagram of a display substrate provided by an example of an embodiment of the present disclosure; and FIG. 3 is a partial enlarged structural schematic diagram of the display substrate shown in FIG. 2. As shown in FIG. 2 and FIG. 3, the display substrate includes a base substrate 100 and a plurality of data lines 200 located on the base substrate 100. The display substrate includes a first display region 111 and a second display region 112; and the first display region 111 is located at the periphery of the second display region 112. For example, the first display region 111 surrounds the second display region 112, that is, the second display region 112 may be surrounded by the first display region 111. Of course, the embodiment of the present disclosure is not limited thereto, the second display region 112 may also be arranged in other position, and the position of the second display region 112 may be determined according to needs; for example, the second display region 112 may be located in a top center position of the entire display region (including the first display region and the second display region), or may also be located in an upper left corner or an upper right corner of the entire display region. FIG. 2 schematically shows that a shape of the first display region 111 is a rectangle, and a shape of the second display region 112 is a circle, but it is not limited thereto; the shape of the second display region 112 may also be a regular shape such as a rectangle or an ellipse or an irregular shape, and the shape of the first display region 111 may also be a regular shape such as a circle or a hexagon or an irregular shape.

As shown in FIG. 2 and FIG. 3, the first display region 110 includes a plurality of first light-emitting elements 111, a plurality of first pixel circuits 112, a plurality of second pixel circuits 113, and a plurality of third pixel circuits 114; the plurality of first pixel circuit 112 are connected with the plurality of first light-emitting elements 111 in one-to-one correspondence to drive the plurality of first light-emitting elements 111 to emit light; the second display region 120 includes a plurality of second light-emitting elements 121; the plurality of second pixel circuits 113 are connected with the plurality of second light-emitting elements 121 in one-to-one correspondence to drive the plurality of second light-emitting elements 121 to emit light; and the third pixel circuit 114 is a dummy pixel circuit. The above-described dummy pixel circuit refers to a pixel circuit not connected with any light-emitting element. The second display region is only provided with a transparent second light-emitting element, but is not provided with any non-transparent pixel circuit; the second display region may be used as an under-screen imaging region, which may not only have higher light transmittance to implement an imaging function, but also implement light emission by connection with pixel circuits in other regions without affecting a display function of the screen.

For example, in a direction perpendicular to the base substrate 100, at least part of the first pixel circuits 112 overlap with the first light-emitting elements 111 connected therewith; the second pixel circuits 113 do not overlap with the second light-emitting elements 121 connected therewith. Or, for example, in the direction perpendicular to the base substrate 100, an average distance between the first pixel circuits 112 and the first light-emitting elements 111 connected therewith is smaller than an average distance between the second pixel circuits 113 and the second light-emitting elements 121 connected therewith. The average distance is, for example, an average value of distances between drive transistors of, for example, a column of pixel circuits and centers of light-emitting elements connected therewith. For example, the second pixel circuit 113 may be connected with a corresponding second light-emitting element 121 through a transparent wiring 400; and neither the second pixel circuit 113 nor the third pixel circuit 114 overlaps with the light-emitting element. For example, the second pixel circuits 113 may be located only on both sides of the second display region 120 along the X direction; and the first pixel circuits 112 include not only portions located on both sides of the second display region 120 along the X direction, but also portions located on both sides of the second display region 120 along a Y direction.

For example, a pixel circuit column in which the second pixel circuits 113 are arranged along the first direction includes the third pixel circuit 114; and the third pixel circuit 114 in the pixel circuit column overlaps or is electrically connected with the second data line 220. For example, the pixel circuit column where the second pixel circuit 113 is located (e.g., a plurality of pixel circuits arranged along the Y direction is a pixel circuit column) includes the third pixel circuit 114 in addition to the second pixel circuit 113. For example, in order to ensure uniformity of pixel circuits, the number of pixel circuits included in the pixel circuit column where the second pixel circuit 113 is located may be substantially equal to the number of pixel circuits included in the pixel circuit column (other pixel circuit columns except for the pixel circuit column having the data line connected with the pixel circuit column pass through the second display region) where the first pixel circuit 112 is located. However, the pixel circuit column where the first pixel circuit 112 is located includes only the first pixel circuit 112, and the pixel circuit column where the second pixel circuit 113 is located includes the second pixel circuit 113 and the third pixel circuit 114. For example, at least one first pixel circuit column may be provided between two pixel circuit columns where adjacent second pixel circuits are respectively located.

For example, the plurality of pixel circuits included in the first display region 110 are arranged in an array along the first direction and the second direction; and the plurality of second pixel circuits 113 are located on both sides of the second display region 120 in the second direction.

For example, the display substrate further includes a plurality of third pixel circuit columns (not shown in FIG. 2 and FIG. 3, the respective third pixel circuit columns only include third pixel circuits); and at least one first pixel circuit column is arranged between adjacent third pixel circuit columns. For example, the third pixel circuit column includes portions distributed on both sides of the second display region 120 in the X direction; and the third pixel circuit column may also be distributed in another portion on both sides of the second display region 120 along the Y direction.

As shown in FIG. 2 and FIG. 3, the plurality of data lines 200 do not pass through the second display region 120 to prevent light transmittance of the second display region 120 from being affected. In a display apparatus having a full display camera, the plurality of data lines are arranged in two modes: winding inside the second display region and winding outside the second display region. Because of limitation of a space size of the second display region, the display substrate provided by the embodiment of the present disclosure is designed according to a fully compressed pixel circuit solution, and the data line is arranged by winding the data line outside the second display region 120. The plurality of data lines 200 include a plurality of first data lines 210 and a plurality of second data lines 220; the respective first data lines 210 are configured to be connected with only the first pixel circuits 112, and the respective second data lines 220 are configured to be at least connected with the second pixel circuit 113.

For example, as shown in FIG. 2 and FIG. 3, among the plurality of second data lines 220 located on both sides of the second display region 120 in the X direction, a plurality of first data lines 210 may be provided between adjacent second data lines 220. For example, there are 2 to 10 first data lines (FIG. 3 schematically shows 2 first data lines), which will not be limited in the embodiment of the present disclosure, and may be set according to actual product requirements. For example, the plurality of second data lines 220 located on both sides of the second display region 120 in the X direction may be uniformly distributed, but it is not limited thereto. For example, according to wiring requirements, the second data lines may be non-uniformly distributed, and the numbers of first data lines provided between adjacent second data lines may be different.

As shown in FIG. 2 and FIG. 3, along the direction perpendicular to the base substrate 100, part of the plurality of third pixel circuits 114 overlap with the plurality of second data lines 220 (e.g., the third pixel circuit overlapping and connected with the second data line may implement electrical connection through a via hole perpendicular to the substrate); and at least part of the third pixel circuits 114 overlapping with the second data line 220 are insulated from the second data line 220 (e.g., as compared with the normal pixel circuit, at least part of via hole positions used for the pixel circuits to be electrically connected with the data lines are not provided with via holes and are isolated by an insulating layer, so that the pixel circuit cannot be electrically connected with the data line to implement the function of the pixel circuit). As shown in FIG. 3, a black dot provided between the data line 200 and the pixel circuit overlapping therewith indicates that the two have a connection relationship; and by providing no black dot between the data line 200 and the pixel circuit overlapping therewith, it indicates that the two are insulated, that is, the two have no connection relationship.

In the display substrate provided by the embodiment of the present disclosure, by arranging at least part of the third pixel circuits overlapping with the second data line to be insulated from the second data line, the number of pixel circuits connected with the second data line may be reduced to reduce data loading, so, when all the data lines input the same signal simultaneously (ET lighting), the phenomenon of dark vertical stripes in the second display region may be alleviated, to improve display quality of the display substrate. In addition, the number of pixel circuits connected with the second data line is reduced to reduce data loading, which may also reduce burden of a driver IC when each data line inputs a corresponding data signal (module lighting).

For example, as shown in FIG. 2 and FIG. 3, the respective third pixel circuit 114 overlapping with the second data line 220 are insulated from the second data line 220, that is, all third pixel circuits 114 overlapping with second data line 220 are not connected with the second data line 220; the pixel circuits connected with the second data line 220 are all pixel circuits configured to drive the light-emitting element to emit light, thereby greatly reducing the number of pixel circuits connected with the second data line, and further reducing data loading of the second data line.

For example, as shown in FIG. 2 and FIG. 3, the respective first data lines 210 extend along the first direction, for example, the first direction is schematically shown as the Y direction in the diagram, but it is not limited thereto, and may also be the X direction as shown in the diagram. A first data line 210 whose extension line does not pass through the second display region 120 among the plurality of first data lines is configured to transmit a data signal to the M first pixel circuits 112, for example, the first data line 210 may run through the first display region 110. The respective second data lines 220 are configured to transmit signals to N pixel circuits, M≥N, and the N pixel circuits at least include a second pixel circuit. The N pixel circuits here refer to the pixel circuits connected with the second data line 220, including a second pixel circuit connected with a second sub-data line and a first pixel circuit connected with a first sub-data line as described later, or only includes a second pixel circuit.

For example, in the examples shown in FIG. 2 and FIG. 3, the first data lines 210 only include data lines located on both sides of the second display region 120 in the X direction; and in the case where the second data line 220 is not connected with the dummy pixel circuit, the number N of pixel circuits connected with the second data line 220 is not greater than the number M of pixel circuits connected with the first data line 210. For example, the number N of pixel circuits connected with the second data line 220 is equal to the number M of first pixel circuits 111 connected with the first data line 210.

For example, as shown in FIG. 2 and FIG. 3, each second data line 220 includes a first sub-data line 221 and a second sub-data line 222 extending along the first direction, and an adapt line 223 connecting the first sub-data line 221 and the second sub-data line 222.

For example, as shown in FIG. 2 and FIG. 3, the first sub-data line 221, the second sub-data line 222, and the first data line 210 are arranged in the same layer; the first sub-data line 221 is configured to be connected with the first pixel circuit 112; and the second sub-data line 222 is configured to be connected with the second pixel circuit 113.

For example, the first sub-data line 221 included in the second data line 220 is a data line extending to an edge of the second display region 120. In the example shown in FIG. 2 and FIG. 3, the data line 200 connected with the first pixel circuits 112 located on both sides of the second display region 120 in the X direction is the first data line 210; the data line 200 connected with the first pixel circuits 112 located on both sides of the second display region 120 in the Y direction is the first sub-data line 221 in the second data line 220; and the data line 200 connected with the second pixel circuit 113 is the second sub-data line 222 in the second data line 220.

For example, FIG. 2 and FIG. 3 schematically show that the first sub-data line 221 in the respective second data lines 220 includes two portions distributed on both sides of the second display region 120 in the Y direction, but it is not limited thereto, the first sub-data line included in the respective second data lines may also be located only on one side of the second display region, for example, there is no first pixel circuit and first sub-data line arranged above the second display region (a direction indicated by the arrow in the Y direction is an upward direction).

For example, as shown in FIG. 2 and FIG. 3, the display substrate includes an adapt region 2230; a plurality of adapt lines 223 are arranged in the adapt region 2230; the adapt region 2230 includes a first adapt region 2231 located on a side of the second display region 120 in the first direction; and the adapt region 2230 also includes a second adapt region 2232 located on the other side of the second display region 120 in the first direction.

For example, as shown in FIG. 2 and FIG. 3, the adapt line 223 in the first adapt region 2231 extends along the second direction intersecting with the first direction. The diagram schematically shows that the second direction is the X direction, but it is not limited thereto, and the first direction and the second direction may be interchanged. FIG. 2 and FIG. 3 schematically show that the first direction and the second direction are perpendicular to each other, but are not limited thereto, and the first direction and the second direction may not be perpendicular to each other.

For example, as shown in FIG. 2 and FIG. 3, the adapt line 223 in the first adapt region 2231 and the first sub-data line 221 are located in different layers, for example, the adapt line 223 may be located on a side of the first sub-data line 221 that is away from the base substrate 100.

For example, as shown in FIG. 2 and FIG. 3, the adapt line 223 in the second adapt region 2232 may include a first adapt line 223-1 and a second adapt line 223-2 that are connected with each other and arranged in different layers. One of the first adapt line 223-1 and the second adapt line 223-2 is connected with the second sub-data line 222 and is located in a different layer from the second sub-data line 222.

For example, as shown in FIG. 3, each adapt line 223 includes two second adapt lines 223-2, and one first adapt line 223-1 connecting the two second adapt lines 223-2; one of the two second adapt lines 223-2 is connected with the second sub-data line 222, and the other of the two second adapt lines 223-2 is connected with the first sub-data line 221. For example, the first adapt line 223-1 extends along the second direction; and the second adapt line 223-2 extends along the first direction. For example, the first adapt line 223-1 may be substantially parallel to the adapt line 223 located in the first adapt region 2231.

For example, the second adapt line 223-2 and the second sub-data line 222 are located in different layers. For example, the first adapt line 223-1 and the second sub-data line 222 may be located in the same layer. Of course, the embodiment of the present disclosure is not limited thereto, the first adapt line may be located in a different layer from the second sub-data line, and the second adapt line may be located in the same layer as the second sub-data line.

For example, as shown in FIG. 2 and FIG. 3, the second data line 220 includes five portions connected sequentially, for example, a first sub-data line 221, an adapt line 223, a second sub-data line 222, an adapt line 223, and a first sub-data line 221. For example, the above-described two first sub-data lines 221 are respectively connected with the same continuous second sub-data line 222 through two portions of adapt line 223; the two first sub-data lines 221 are respectively located on both sides of the second display region 120 in the first direction; and the two first sub-data lines 221 are located on the same straight line. In the embodiment of the present disclosure, the two data lines being located on the same straight line refers to that the two data lines are substantially located on the same straight line, for example, more than 50% of the two data lines are located on the same straight line, or a maximum offset distance of the two data lines in the second direction is less than 5 microns, or 3 microns, etc.

For example, the data signal is loaded on the first data line 210 located on left and right sides of the second display region 120 through a circuit board (not shown) located on a lower side of the first display region 110, so as to be supplied to the M first pixel circuits 112 connected with the first data line 210; the data signal is loaded on the first sub-data line 221 located on a lower side of the second display region 120 through a circuit board located on a lower side of the first display region 110, so as to be supplied to the first pixel circuit 112 connected with the first sub-data line 221; the data signal loaded on the first sub-data line 221 located on a lower side of the second display region 120 is transmitted to the second sub-data line 222 through the first adapt line 223, so as to be supplied to the second pixel circuit 113; then the data signal is transmitted to the first sub-data line 221 located on an upper side of the second display region 120 through the second adapt line 223, so as to be supplied to the first pixel circuit 112, then the first sub-data lines located on both sides of the second display region and the second sub-data line connected with the two first sub-data lines all transmit the same data signal; and such data signal transmission mode may be referred to as single-channel drive.

As shown in FIG. 2, the numbers of first pixel circuits 112 connected with the above-described two first sub-data lines 221 are respectively a1 and a3, the number of second pixel circuits 113 connected with the second sub-data line 222 is a2, then the number N of pixel circuits connected with the second data line 220 is equal to a1+a2+a3, and the number M of first pixel circuits 111 connected with the first data line 210 is also equal to a1+a2+a3, so M=N. The data lines in the display substrate shown in FIG. 2 adopt single-channel drive; by reducing the number of third pixel circuits connected with the second data line, the number of pixel circuits connected in series on the second data line may be reduced, so that M=N, thereby reducing data loading of the second data line to a certain extent, so that in the case where all the data lines input the same signal simultaneously (ET lighting), the phenomenon of dark vertical stripes in the position of the second display region may be alleviated. In addition, the number of pixel circuits connected with the second data line is reduced to reduce data loading, which may also reduce burden of the driver IC in the case where each data line inputs a corresponding data signal (module lighting).

Because the second display region is provided with first pixel circuits on both sides in the first direction, the second display region is provided with first sub-data lines connected with the first pixel circuits on both sides in the first direction; in single-channel drive, two portions of first sub-data line need to implement electrical connection through the second sub-data line and the two portions of adapt line, so the adapt region includes a first adapt region and a second adapt region located on both sides of the second display region.

For example, the second adapt region 2232 is located in a non-display region other than the first display region 110 and the second display region 112 to prevent the adapt line in the second adapt region from affecting a display effect of the display substrate.

For example, a distance between two adjacent first adapt lines 223-1 located in the second adapt region 2232 may be less than a distance between two adjacent adapt lines 223 located in the first adapt region 2231, to minimize a size of the frame, so as to implement a narrow frame.

For example, as shown in FIG. 2 and FIG. 3, the third pixel circuits 114 include two portions located on both sides in the first direction of the respective second pixel circuit columns extending along the first direction, that is, in the pixel circuit column where the second pixel circuit 113 is located, the third pixel circuits 114 include two portions distributed on both sides of the second pixel circuit 113.

Of course, the embodiment of the present disclosure is not limited thereto; upon the second display region being located in a top position of the entire display region, the third pixel circuit may only be located on a lower side of the respective second pixel circuit columns, that is, there is no third pixel circuit provided on an upper side of the second pixel circuit. The upper side and the lower side are, for example, both sides along a longitudinal direction of the entire display region, and the top position is, for example, an end away from the driver IC. At this time, upon a shape of the first display region being a rectangle and a shape of the second display region being a circle, some first pixel circuits are further provided on an upper edge of the second display region, and the adapt region further includes the first adapt region and the second adapt region as shown in FIG. 2; upon the shape of the first display region being a rectangle, and the shape of the second display region being also a rectangle, the upper edge of the first display region may be flush with the upper edge of the second display region; at this time, no first pixel circuit is provided on the upper side of the second display region, the adapt region only includes the first adapt region shown in FIG. 2, and the second adapt region is omitted, which may further implement a narrow frame.

For example, as shown in FIG. 2 and FIG. 3, the display substrate further includes a plurality of wirings 300 extending along the first direction, the wirings 300 do not pass through the second display region 120, the plurality of wirings 300 are arranged in the same layer as the plurality of data lines 200, at least one data line 200 is arranged between two adjacent wirings 300; and along the direction perpendicular to the base substrate 100, the respective wirings 300 only overlap with the third pixel circuits 114. For example, the respective wirings 300 are connected with the third pixel circuits 114 overlapping therewith. The wiring according to the embodiment of the present disclosure is a wiring only overlapping with the dummy pixel circuit.

For example, the wirings 300 include a first wiring 310; the number of first wirings 310 is equal to the number of second sub-data lines 222; the respective first wirings 310 and one second sub-data line 222 are substantially located on the same line with a space 230 provided therebetween; the same line is, for example, a straight line extending substantially along the second direction, or may also have certain bending in some positions, but have a main body portion, for example, more than 50% on the same line. For example, each first wiring 310 and at least a portion of one second sub-data line 222 are located on the same line with the space 230 provided therebetween. For example, one second sub-data line 222 and one first wiring 310 located on the same line may be two disconnected portions in a metal line, and a length of the second sub-data line 222 is less than a length of the first data line 210, which may reduce data loading of the second sub-data line 222.

For example, as shown in FIG. 2 and FIG. 3, the space 230 between the second sub-data line 222 and the first wiring 310 is located on a side of the first adapt region 2231 that is away from the second display region 120, then the first wiring 310 does not affect the data signal transmitted on the second sub-data line 222.

For example, as shown in FIG. 2 and FIG. 3, the respective first wirings 310 are connected with the third sub-pixels 114 overlapping therewith, and are configured to transmit electrical signals. In the embodiment of the present disclosure, by connecting the first wiring and the third pixel circuit overlapping with the first wiring, and transmitting the electrical signal on the first wiring, floating of the first wiring may be avoided.

For example, the second sub-data line 222 is configured to transmit a data signal data; and an electrical signal transmitted on the first wiring 310 is different from a signal transmitted on the second sub-data line 222.

For example, the first wiring 310 is configured to transmit a power voltage signal. For example, it may be a constant positive voltage VDD, but is not limited thereto, or may also be other electrical signal, for example, a reset voltage signal.

For example, as shown in FIG. 2, the wirings 300 further includes second wirings 320 extending along the first direction; and the second wirings 320 include portions located on both sides of the second display region 120 in the X direction and a portion located on at least one side of the second display region 120 in the Y direction. For example, among the second wirings 320 located on both sides of the second display region 120 in the X direction, a plurality of first data lines 210 are provided between two adjacent second wirings 320, or a plurality of second sub-data lines 222 are arranged between two adjacent second wirings 320. Among the second wirings 320 located on at least one side of the second display region 120 in the Y direction, a plurality of first sub-data lines 221 are provided between two adjacent second wirings 320. For example, among the second wirings 320 located on both sides of the second display region 120 in the Y direction, a plurality of first sub-data lines 221 are provided between two adjacent second wirings 320 in the second wirings 320 on either side. FIG. 2 does not show the second wirings located on both sides of the second display region 120 in the Y direction.

For example, each second wiring 320 may transmit a power voltage signal. For example, the plurality of second wirings 320 may be connected with one connection line extending in the X direction. But it is not limited thereto, the second wirings located on one side of the second display region may not transmit electrical signals, that is, they may be floating.

Figure 4:
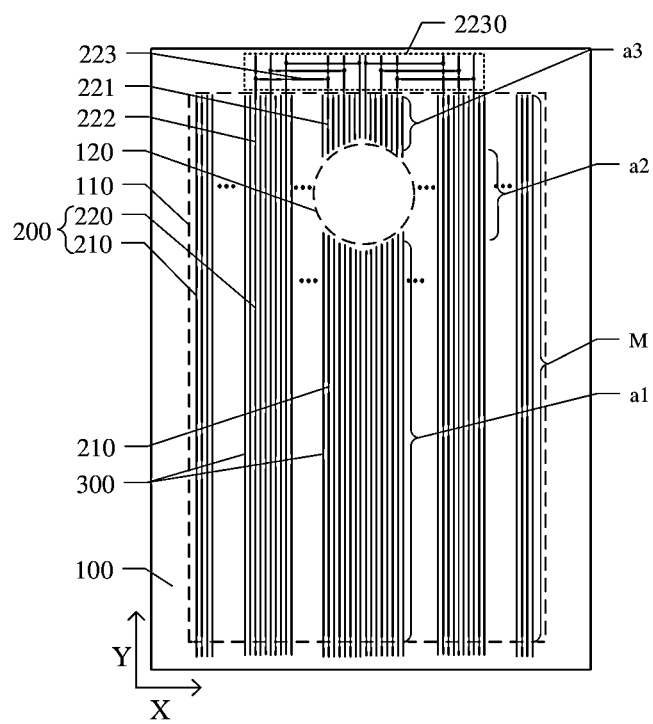
FIG. 4 is a partial planar structural schematic diagram of a display substrate provided by another example of an embodiment of the present disclosure.
Figure 5:
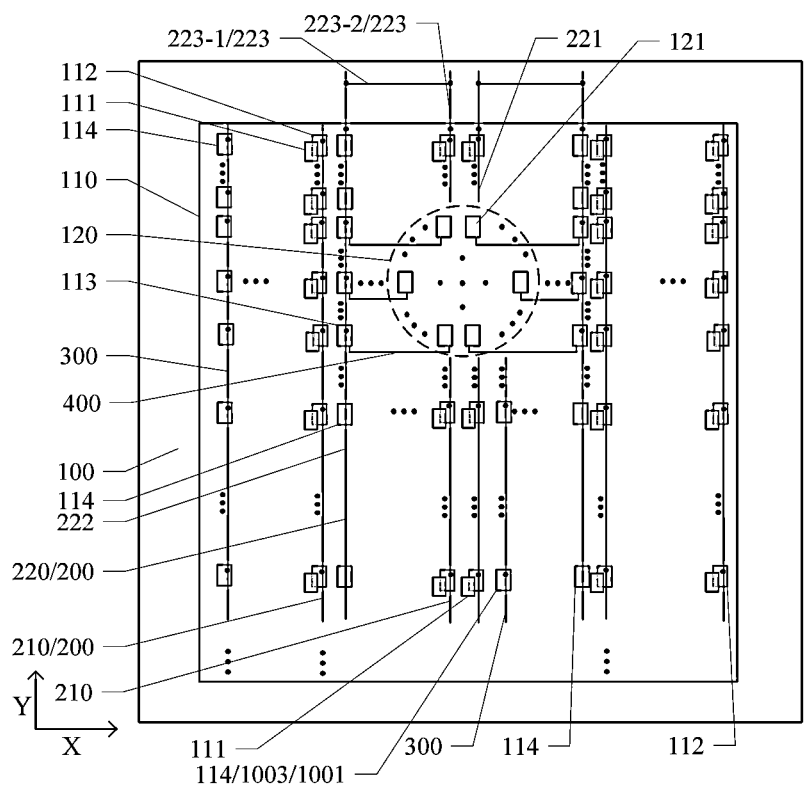
FIG. 5 is a partial enlarged structural schematic diagram of the display substrate shown in FIG. 4.

FIG. 4 is a partial planar structural schematic diagram of a display substrate provided by another example of an embodiment of the present disclosure; and FIG. 5 is a partial enlarged structural schematic diagram of the display substrate shown in FIG. 4. As shown in FIG. 4 and FIG. 5, the example shown in FIG. 4 and FIG. 5 differs from the example shown in FIG. 2 and FIG. 3 in that: the first pixel circuit 112 located on at least one side of the second display region 120 in the first direction is connected with the first data line 210, and the first data line 210 is not connected with the second sub-data line 222.

For example, as shown in FIG. 4 and FIG. 5, the respective second sub-data lines 222 extend along the first direction, and orthographic projections of the second sub-data lines 222 overlap with orthographic projections of the respective wirings 300 on a straight line extending along the first direction. In the example, the respective second sub-data lines 222 are basically the data lines 200 running through the first display region 110, the respective second sub-data lines 222 are not located on the same straight line with any wiring 300, that is, the wirings 300 only include one portion running through the first display region 110 and the other portion extending to an edge of the second display region 120.

For example, as shown in FIG. 4 and FIG. 5, the first data line 210 is connected with the first pixel circuits 112 located on one side of the second display region 120 in the Y direction and the first pixel circuits 112 located on both sides of the second display region 120 in the X direction.

For example, as shown in FIG. 4 and FIG. 5, each first sub-data line 221 and one first data line 210 are respectively located on both sides of the second display region 120 in the first direction, and are located on the same straight line; and the respective first sub-data lines 221 and the first data line 210 located on the same straight line as the first sub-data line 221 are configured to transmit the same data signal.

For example, as shown in FIG. 4 and FIG. 5, the number of first pixel circuits 112 connected with the respective first data lines 210 located on both sides of the second display region 120 in the X direction is M; and the number of first pixel circuits 112 connected with the first data lines 210 located on one side of the second display region 120 in the Y direction is a1.

For example, as shown in FIG. 4 and FIG. 5, each second data line 220 includes a first sub-data line 221, a second sub-data line 222, and an adapt line 223 connecting the first sub-data line 221 and the second sub-data line 222. For example, the adapt line 223 is located in a non-display region other than the first display region 110 and the second display region 120. The second data line 220 includes three portions connected sequentially, for example, a second sub-data line 222, an adapt line 223 and a first sub-data line 221.

For example, as shown in FIG. 4 and FIG. 5, the number of second pixel circuits 113 connected with the second sub-data line 222 is a2; and the number of first pixel circuits 112 connected with the first sub-data line 221 is a3.

For example, the data signal is loaded on the first data lines 210 located on the left and right sides of the second display region 120 through a circuit board (not shown) located on the lower side of the first display region 110, so as to be supplied to the M first pixel circuits 112 connected with the first data line 210; the data signal is loaded on the first sub-data line 221 located on the lower side of the second display region 120 through the circuit board located on the lower side of the first display region 110, so as to be supplied to the a1 first pixel circuits 112 connected with the first sub-data line 221; the data signal is loaded on the second sub-data lines 222 located on the left and right sides of the second display region 120 through a circuit board located on the lower side of the first display region 110, so as to be supplied to the a2 second pixel circuits 113 connected with the second sub-data line 222; then the data signal is transmitted to the first sub-data line 221 located on the upper side of the second display region 120 through the adapt line 223, so as to be supplied to the a3 first pixel circuits 112 connected with the first sub-data line 221; the first data line 210 located on the lower side of the second display region 120 and the first sub-data line 221 located on the same straight line as the first data line 210 are configured to transmit the same data signal; and the data signal transmission mode may be referred to as dual-channel drive.

In the dual-channel drive mode, the number M of first pixel circuits connected on the first data line whose extension line does not pass through the second display region among the plurality of first data lines is (a1+a2+a3); the number a1 of first pixel circuits connected on the first data line whose extension line passes through the second display region is less than M; the number N of pixel circuits connected on the second data line is (a2+a3); and N is less than M. The data lines in the display substrate shown in FIG. 4 adopt dual-channel drive. By reducing the number of third pixel circuits connected with the second data line, the number of pixel circuits connected in series on the second data line may be reduced, so that M is greater than or equal to N, so as to reduce data loading of the second data line to a certain extent, which may further alleviate the phenomenon of dark vertical stripes in the position of the second display region in the case where all the data lines input the same signal simultaneously (ET lighting). In addition, the number of pixel circuits connected with the second data line is reduced to reduce data loading, which may also reduce burden of the driver IC in the case where each data line inputs a corresponding data signal (module lighting).

For example, as shown in FIG. 4 and FIG. 5, a length of each second sub-data line 222 is not less than a length of the first data line 210 whose extension line does not pass through the second display region 120. For example, the second sub-data lines 222, part of the first data lines 120, and part of the wirings 300 all run through the first display region 110.

Because the second sub-data line has the same length as the first data line whose extension line does not pass through the second display region, the second sub-data line with the length as mentioned above is only connected with the second pixel circuit and not connected with any dummy pixel circuit, and meanwhile, the second sub-data line is not connected with the first sub-data line through an adapt line, capacitance generated by the second sub-data line may be reduced.

For example, as shown in FIG. 4 and FIG. 5, the respective adapt lines 223 include a first adapt line 223-1 and a second adapt line 223-2 that are connected with each other and arranged in different layers; one of the first adapt line 223-1 and the second adapt line 223-2 is connected with the second sub-data line 222 and is located in a different layer from the second sub-data line 222.

For example, as shown in FIG. 4 and FIG. 5, the other of the first adapt line 223-1 and the second adapt line 223-2 extends in the second direction intersecting with the first direction, and is located in the same layer as the second sub-data line 212.

Figure 6:
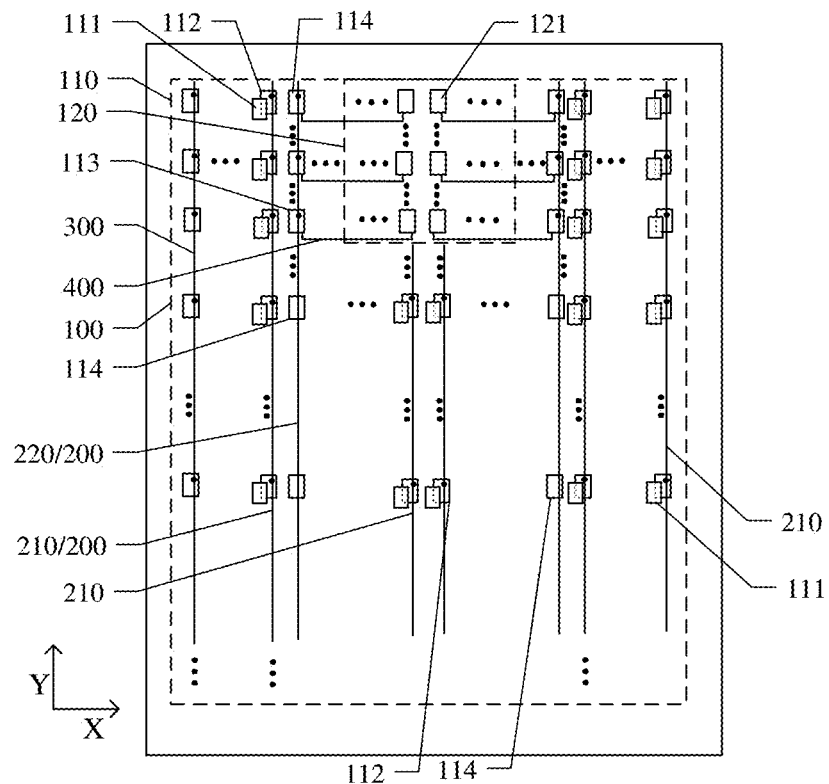
FIG. 6 is a partial planar structural schematic diagram of a display substrate provided by another example of an embodiment of the present disclosure.

FIG. 6 is a partial planar structural schematic diagram of a display substrate provided by another example of an embodiment of the present disclosure. As shown in FIG. 6, the example shown in FIG. 6 differs from the example shown in FIG. 5 in that, the respective second data lines 220 extend along the first direction, and the respective second data lines 220 are configured to be only connected with the second pixel circuits 113. As shown in FIG. 6, the second display region 120 and the first display region 110 have the same shape, and one side edge (e.g., an upper side edge) of the second display region 120 is flush with one side edge (e.g., an upper side edge) of the first display region 110, so that the first pixel circuits 112 are only distributed on three sides of the second display region 120.

For example, as shown in FIG. 6, the first pixel circuits 112 are provided on one side of the second display region 120 in the Y direction and the other side of the second display region 120 in the Y direction is not provided with the first pixel circuits 112, and then the second data line 220 is only configured to supply a data signal to the second pixel circuit 113, without supplying any data signal to the first pixel circuit.

For example, as shown in FIG. 6, all the third pixel circuits 114 overlapping with second data line 220 may be insulated from the second data line 220, but it is not limited thereto, and in the third pixel circuits 114 overlapping with second data line 220, it may also be that part of the third pixel circuits are connected with the second data line, and the other part of the third pixel circuits are insulated from the second data line.

Figure 7:
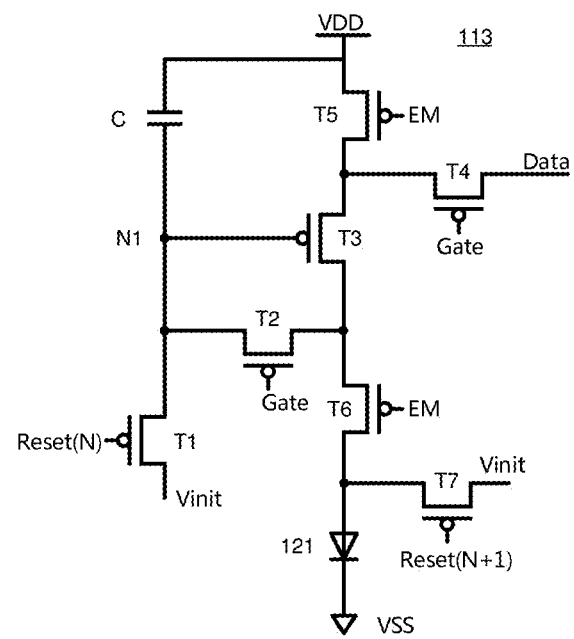
FIG. 7 is an equivalent diagram of respective pixel circuits in the display substrate shown in FIG. 2 to FIG. 6.

For example, FIG. 7 is an equivalent diagram of respective pixel circuits in the display substrate shown in FIG. 2 to FIG. 6. Taking the pixel circuit shown in FIG. 7 as the second pixel circuit 113 as an example, the second pixel circuit 113 is configured to drive the second light-emitting element 121 to emit light. Other pixel circuits, for example, the first pixel circuit and the third pixel circuit, have the same structure as the second pixel circuit, but the third pixel circuit is not connected with the light-emitting element. For example, the display substrate further includes a reset power signal line, a scan signal line, a power signal line, a reset control signal line, and a light-emitting control signal line on the base substrate.

For example, as shown in FIG. 7, the second pixel circuit 113 includes a data writing transistor T4, a drive transistor T3, a threshold compensating transistor T2, and a first reset control transistor T7. A first electrode of the threshold compensating transistor T2 is connected with a first electrode of the drive transistor T3, a second electrode of the threshold compensating transistor T2 is connected with a gate electrode of the drive transistor T3; a first electrode of the first reset control transistor T7 is connected with the reset power signal line to receive a reset signal Vinit, a second electrode of the first reset control transistor T7 is connected with the second light-emitting element 121; and a first electrode of the data writing transistor T4 is connected with a second electrode of the drive transistor T3. For example, as shown in FIG. 7, the second pixel circuit 113 further includes a storing capacitor C, a first light-emitting control transistor T6, a second light-emitting control transistor T5, and a second reset transistor T1. A gate electrode of the data writing transistor T4 is electrically connected with the scan signal line to receive a scan signal Gate; a first electrode of the storing capacitor C is electrically connected with the power signal line, a second electrode of the storing capacitor C is electrically connected with the gate electrode of the drive transistor T3; a gate electrode of the threshold compensating transistor T2 is electrically connected with the scan signal line to receive a compensation control signal; a gate electrode of the first reset transistor T7 is electrically connected with the reset control signal line to receive a reset control signal Reset(N+1); a first electrode of the second reset transistor T1 is electrically connected with the reset power signal line to receive a reset signal Vinit, a second electrode of the second reset transistor T1 is electrically connected with the gate electrode of the drive transistor T3, a gate electrode of the second reset transistor T1 is electrically connected with the reset control signal line to receive a reset control signal Reset(N); a gate electrode of the first light-emitting control transistor T6 is electrically connected with the light-emitting control signal line to receive a light-emitting control signal EM; a first electrode of the second light-emitting control transistor T5 is electrically connected with the power signal line to receive a power voltage signal VDD, a second electrode of the second light-emitting control transistor T5 is electrically connected with the second electrode of the drive transistor T3, a gate electrode of the second light-emitting control transistor T5 is electrically connected with the light-emitting control signal line to receive a light-emitting control signal EM, and a first electrode of the second light-emitting element 121 is connected with a voltage end to receive a signal VSS. The above-described power signal line refers to a signal line that outputs a power voltage signal VDD, and may be connected with a voltage source to output a constant voltage signal, for example, a positive voltage signal.

For example, the scan signal and the compensation control signal may be the same, that is, the gate electrode of the data writing transistor T3 and the gate electrode of the threshold compensating transistor T2 may be electrically connected with the same signal line to receive the same signal, thus reducing the number of signal lines. For example, the gate electrode of the data writing transistor T3 and the gate electrode of the threshold compensating transistor T2 may also be respectively electrically connected with different signal lines, that is, the gate electrode of the data writing transistor T3 is electrically connected with the first scan signal line, the gate electrode of the threshold compensating transistor T2 is electrically connected with the second scan signal line, and the signals transmitted by the first scan signal line and the second scan signal line may be the same or different, so that the gate electrode of the data writing transistor T3 and the gate electrode of the threshold compensating transistor T2 may be controlled separately to increase flexibility of controlling the pixel circuit.

For example, the light-emitting control signals input to the first light-emitting control transistor T6 and the second light-emitting control transistor T5 may be the same, that is, the gate electrode of the first light-emitting control transistor T6 and the gate electrode of the second light-emitting control transistor T5 may be electrically connected with the same signal line to receive the same signal, thus reducing the number of signal lines. For example, the gate electrode of the first light-emitting control transistor T6 and the gate electrode of the second light-emitting control transistor T5 may also be respectively electrically connected with different light-emitting control signal lines, and signals transmitted by different light-emitting control signal lines may be the same or different.

For example, the reset control signals input to the first reset transistor T7 and the second reset transistor T1 may be the same, that is, the gate electrode of the first reset transistor T7 and the gate electrode of the second reset transistor T1 may be electrically connected with the same signal line to receive the same signal, thus reducing the number of signal lines. For example, the gate electrode of the first reset transistor T7 and the gate electrode of the second reset transistor T1 may also be respectively electrically connected with different reset control signal lines, and at this time, signals on the different reset control signal lines may be the same or different.

For example, as shown in FIG. 7, in the case where the display substrate is operating, in a first phase of picture display, the second reset transistor T1 is turned on to initialize a voltage of an N1 node; in a second phase of picture display, data is stored in the N1 node through the data writing transistor T4, the drive transistor T3 and the threshold compensating transistor T2; in a third light-emitting phase, the second light-emitting control transistor T5, the drive transistor T3 and the first light-emitting control transistor T6 are all turned on, and the light-emitting element is forward conductive to emit light.

It should be noted that, in the embodiment of the present disclosure, in addition to the 7T1C (i.e., seven transistors and one capacitor) structure shown in FIG. 7, the pixel circuit may further be a structure including other numbers of transistors, such as a 7T2C structure, a 6T1C structure, a 6T2C structure, an 8T1C structure, or a 9T2C structure, which will not be limited in the embodiment of the present disclosure.

Figure 8:
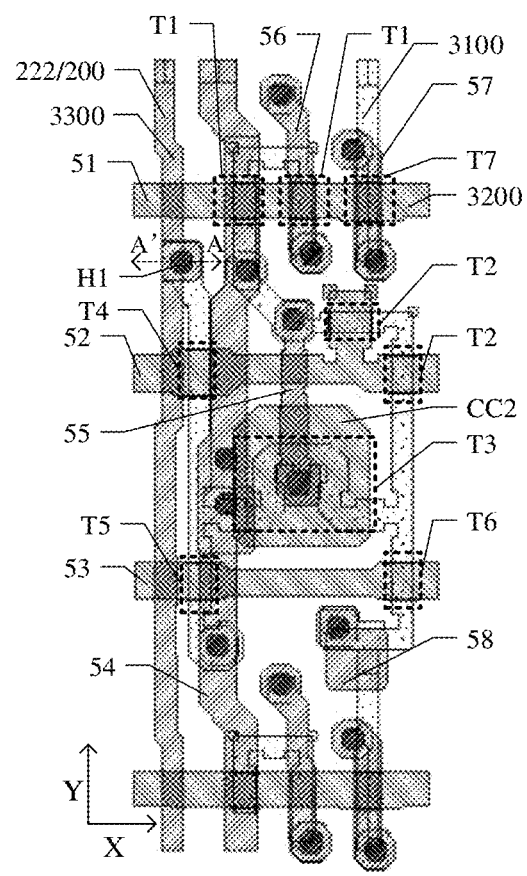
FIG. 8 is a partial planar structural schematic diagram of a laminated structure of an active semiconductor layer, a first conductive layer, and a source-drain metal layer of a second pixel circuit provided by an embodiment of the present disclosure.

FIG. 8 is a partial planar structural schematic diagram of a laminated structure of an active semiconductor layer, a first conductive layer, and a source-drain metal layer of a second pixel circuit provided by an embodiment of the present disclosure. As shown in FIG. 8, the active semiconductor layer 3100 may be formed by patterning a semiconductor material. The active semiconductor layer 3100 may be used to fabricate active layers of the second reset transistor T1, the threshold compensating transistor T2, the drive transistor T3, the data writing transistor T4, the second light-emitting control transistor T5, the first light-emitting control transistor T6, and the first reset control transistor T7 as described above. The active semiconductor layer 3100 includes an active layer pattern (a channel region) and a doped region pattern (a source-drain doped region) of the respective transistors.

For example, the active layer may include an integrally formed low-temperature polysilicon layer; and the source electrode region and the drain electrode region may be conductorized through doping, etc. to implement electrical connection of the respective structures. For example, the active semiconductor layer of the respective transistors is an overall pattern formed of p-silicon; the respective transistors in the same pixel circuit includes a pattern of doped regions (i.e., the source electrode region and the drain electrode region) and an active layer pattern; and active layers of different transistors are separated by a doped structure.

For example, the active semiconductor layer 3100 may be made of amorphous silicon, polysilicon, oxide semiconductor materials, etc. It should be noted that, the above-described source electrode region and drain electrode region may be regions doped with n-type impurities or p-type impurities.

Figure 10:
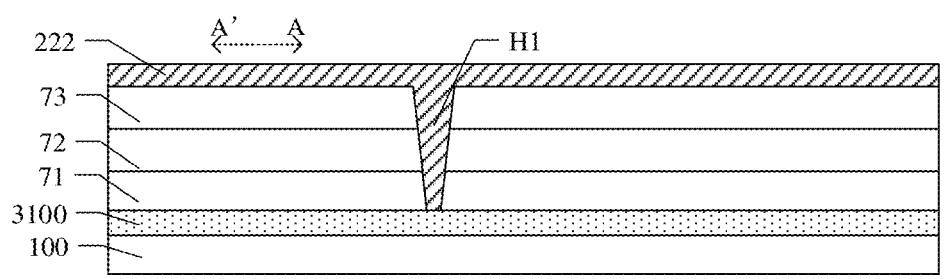
FIG. 10 is a partial cross-sectional structural schematic diagram of the pixel circuit shown in FIG. 8 taken along AA'.

FIG. 10 is a partial cross-sectional structural schematic diagram of the pixel circuit shown in FIG. 8 taken along AA'. As shown in FIG. 8 and FIG. 10, a gate insulating layer 71 is provided on a side of the active semiconductor layer 3100 that is away from the base substrate 100; and a first conductive layer 3200 (i.e., a gate metal layer) is provided on a side of the gate insulating layer 71 that is away from the active semiconductor layer 3100. The first conductive layer 3200 may include a second electrode CC2 of the capacitor C, a scan signal line 52, a reset control signal line 51, and a light-emitting control signal line 53 extending in the X direction, as well as gate electrodes of the second reset transistor T1, the threshold compensating transistor T2, the drive transistor T3, the data writing transistor T4, the second light-emitting control transistor T5, the first light-emitting control transistor T6, and the first reset control transistor T7.

For example, as shown in FIG. 8 and FIG. 10, the gate electrode of the data writing transistor T3 may be a portion where the scan signal line 52 overlaps with the active semiconductor layer 3100; the gate electrode of the first light-emitting control transistor T6 may be a first portion where the light-emitting control signal line 53 overlaps with the active semiconductor layer 3100; and the gate electrode of the second light-emitting control transistor T5 may be a second portion where the light-emitting control signal line 53 overlaps with the active semiconductor layer 3100. The gate electrode of the second reset transistor T1 is a first portion where the reset control signal line 51 overlaps with the active semiconductor layer 3100; and the gate electrode of the first reset control transistor T7 is a second portion where the reset control signal line 51 overlaps with the active semiconductor layer 3100. The threshold compensating transistor T2 may be a thin film transistor having a double-gate structure. As shown in FIG. 8, the gate electrode of the drive transistor T1 may be the second electrode CC2 of the capacitor C.

It should be noted that, the respective dashed rectangular frames in FIG. 8 show the respective portions where the active semiconductor layer 3100 overlaps with the first conductive layer 3200, that is, channel regions. With respect to the channel regions of the respective transistors, the active semiconductor layers on both sides of each channel region are conductorized through processes such as ion doping to serve as a first electrode and a second electrode of each transistor. The source electrode and the drain electrode of the transistor may be symmetrical in structure, so the source electrode and the drain electrode may be indistinguishable in physical structure. In the embodiment of the present disclosure, in order to distinguish the transistors, except for the gate electrode as the control electrode, one electrode is directly described as the first electrode and the other electrode as the second electrode. Therefore, according to the embodiment of the present disclosure, in all or part of the transistors, the first electrode and the second electrode are interchangeable as needed.

For example, as shown in FIG. 8, the scan signal line 52, the reset control signal line 51, and the light-emitting control signal line 53 are arranged in the Y direction. The scan signal line 52 is located between the reset control signal line 51 and the light-emitting control signal line 53. For example, the second electrode CC2 of the capacitor C (i.e., the gate electrode of the drive transistor T1) is located between the scan signal line 52 and the light-emitting control signal line 53.

For example, as shown in FIG. 8, a source-drain metal layer 3300 is provided on a side of the first conductive layer 3200 that is away from the base substrate; and the source-drain metal layer 3300 includes a data line 200 and a power signal line 54 extending in the Y direction. The source-drain metal layer 3300 further includes a first connecting portion 55, a second connecting portion 56, a third connecting portion 57 and a fourth connecting portion 58.

Figure 9:
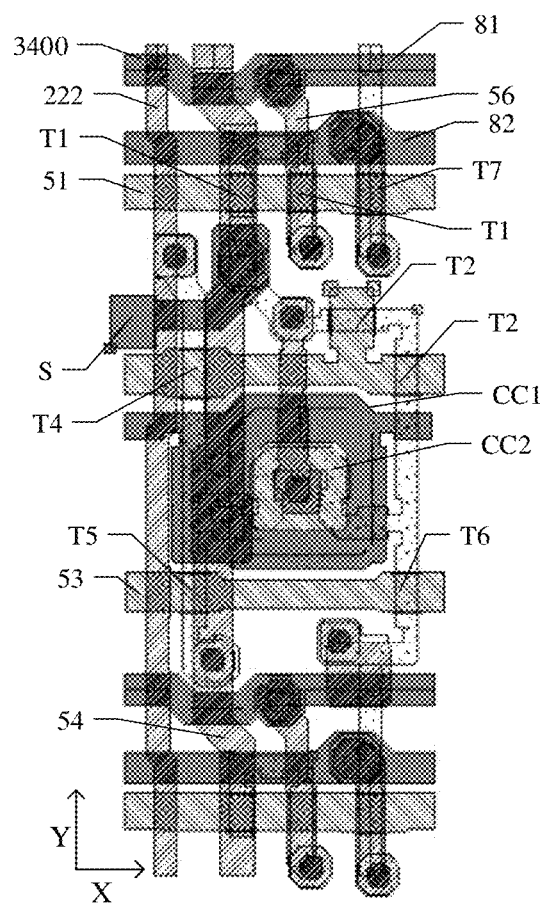
FIG. 9 is a partial planar structural schematic diagram of a laminated structure of an active semiconductor layer, a first conductive layer, a source-drain metal layer, and a second conductive layer of a second pixel circuit provided by an embodiment of the present disclosure.

FIG. 9 is a partial planar structural schematic diagram of a laminated structure of an active semiconductor layer, a first conductive layer, a source-drain metal layer, and a second conductive layer of a second pixel circuit provided by an embodiment of the present disclosure. As shown in FIG. 9 and FIG. 10, a first insulating layer 72 is provided on a side of the first conductive layer 3200 that is away from the base substrate 100; a second conductive layer 3400 is provided on a side of the second insulating layer 72 that is away from the base substrate 100; a second insulating layer 73 is provided on a side of the second conductive layer 3400 that is away from the base substrate 100, and a source-drain metal layer 3300 is provided on a side of the second insulating layer 73 that is away from the base substrate 100.

For example, as shown in FIG. 9, the second conductive layer 3400 includes the first electrode CC1 of the capacitor C as well as the first reset power signal line 81 and the second reset power signal line 82. The first electrode CC1 of the capacitor C and the second electrode CC2 of the capacitor C at least partially overlap with each other to form the capacitor C.

For example, the second conductive layer 3400 further includes a plurality of covering portions S; and the respective threshold compensating transistors T2 include two gate electrodes and an active semiconductor layer located between orthographic projections of the two gate electrodes on the active semiconductor layer 3100. Along the direction perpendicular to the base substrate, the covering portion S overlaps with the active semiconductor layer 3100 between the two gate electrodes.

For example, as shown in FIG. 8 to FIG. 10, the second sub-data line 222 is electrically connected with the second electrode of the data writing transistor T2 in the second pixel circuit through a via hole penetrating through the gate insulating layer 71, the first insulating layer 72, and the second insulating layer 73, so that the second sub-data line 222 inputs a data signal for the second pixel circuit.

For example, as shown in FIG. 8 and FIG. 9, the power signal line 54 is electrically connected with the first electrode of the second light-emitting control transistor T5 through a via hole penetrating through the gate insulating layer, the first insulating layer, and the second insulating layer. The power signal line 54 and the data line 200 are alternately arranged along the X direction. The power signal line 54 is electrically connected with the first electrode CC1 of the capacitor C through a via hole penetrating through the second insulating layer. For example, the above-described second insulating layer is an interlayer insulating layer.

For example, the dual-gate threshold compensating transistor may reduce leakage current. For example, an active semiconductor layer between two channels of the dual-gate threshold compensating transistor T2 is in a floating state when the threshold compensating transistor T2 is turned off, and is susceptible to jumps because of influence of the surrounding line voltage, thus affecting the leakage current of the threshold compensating transistor T2, and further affecting light emission brightness. In order to keep a voltage of the active semiconductor layer between the two channels of the threshold compensating transistor T2 stable, the covering portion S and the active semiconductor layer between the two channels of the threshold compensating transistor T2 are designed to form a capacitor; and the covering portion S may be coupled to the power signal line 54 to obtain a constant voltage, so the voltage of the active semiconductor layer in a floating state may be kept stable. The covering portion S overlaps with the active semiconductor layer between the two channels of the dual-gate threshold compensating transistor T2, which may also prevent the active semiconductor layer between the two gate electrodes from being exposed to light to change characteristics, for example, avoid changes to a voltage of the portion of active semiconductor layer, to as to avoid crosstalk.

For example, as shown in FIG. 8 and FIG. 9, the second electrode of the threshold compensating transistor T2 is electrically connected with the gate electrode of the drive transistor T3 through the first connecting portion 55; a first end of the first connecting portion 55 is connected with second electrode of the threshold compensating transistor T2 through a via hole penetrating through the gate insulating layer, the first insulating layer and the second insulating layer; and a second end of the first connecting portion 55 is connected with the gate electrode of the drive transistor T3 through a via hole penetrating through the first insulating layer and the second insulating layer. For example, the first connecting portion 55 overlaps with the first electrode CC1 of the capacitor C. A first electrode of the second reset transistor T1 is electrically connected with the first reset power signal line 81 through the second connecting portion 56; one end of the second connecting portion 56 is connected with the first electrode of the second reset transistor T1 through a via hole penetrating through the gate insulating layer, the first insulating layer and the second insulating layer, and the other end of the second connecting portion 56 is connected with the first reset power signal line 81 through a via hole penetrating through the second insulating layer. The first electrode of the first reset transistor T7 is electrically connected with the second reset power signal line 82 through the third connecting portion 57; one end of the third connecting portion 57 is connected with the first electrode of the first reset transistor T7 through a via hole penetrating through the gate insulating layer, the first insulating layer, and the second insulating layer, and the other end of the third connecting portion 57 is connected with the second reset power signal line 82 through a via hole penetrating through the second insulating layer. Because the second display region has larger ITO capacitance (i.e., capacitance generated by a transparent wiring, which is used to connect the second light-emitting element and the second pixel circuit, and film layers such as the respective conductive layers, source-drain metal layers overlapping therewith), a rising process of an anode voltage of the second light-emitting element becomes very slow; with respect to low gray scales, turn-on time of the second light-emitting element is greatly delayed; in the embodiment of the present disclosure, the first reset power signal line and the second reset power signal line are used for respective connection with the first reset transistor and the second reset transistor, and a voltage of the first reset power signal is appropriately increased, which may improve unevenness of low gray scale brightness of the second display region.

For example, as shown in FIG. 8 and FIG. 9, the fourth connecting portion 58 is connected with the second electrode of the first light-emitting control transistor T6 through a via hole penetrating through the gate insulating layer, the first insulating layer, and the second insulating layer.

It should be noted that, the first pixel circuit and the second pixel circuit have the same structure; positional relationship and connection relationship between the first pixel circuit and the data line, the scan line, the reset control signal line, the light-emitting control signal line and the power signal line are all the same as relationships between the second pixel circuit and corresponding signal lines; and no details will be repeated here. Similarly, the third pixel circuit and the second pixel circuit have the same structure; positional relationship and connection relationship between the third pixel circuit and the wiring, the scanning line, the reset control signal line, the light-emitting control signal line and the power signal line are all the same as relationships between the second pixel circuit and corresponding signal lines; and no details will be repeated here.

Figure 11:
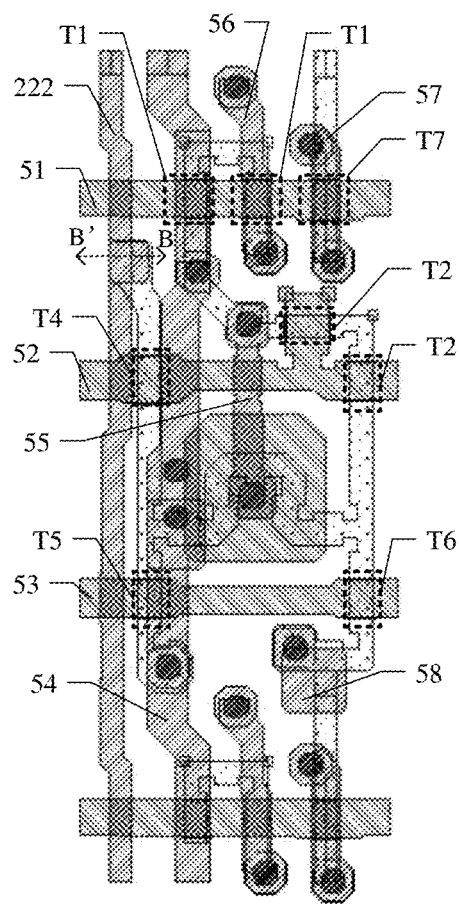
FIG. 11 is a partial planar structural schematic diagram of a laminated structure of an active semiconductor layer, a first conductive layer, and a source-drain metal layer of a third pixel circuit provided by an embodiment of the present disclosure.

For example, FIG. 11 is a partial planar structural schematic diagram of a laminated structure of an active semiconductor layer, a first conductive layer, and a source-drain metal layer of a third pixel circuit provided by an embodiment of the present disclosure. As shown in FIG. 11, the third pixel circuit overlaps with the second sub-data line 222; and the third pixel circuit overlapping with the second sub-data line 222 differs from second pixel circuit overlapping with the second sub-data line 222 in that the third pixel circuit overlapping with the second sub-data line 222 is insulated from the second sub-data line 222.

Figure 12:
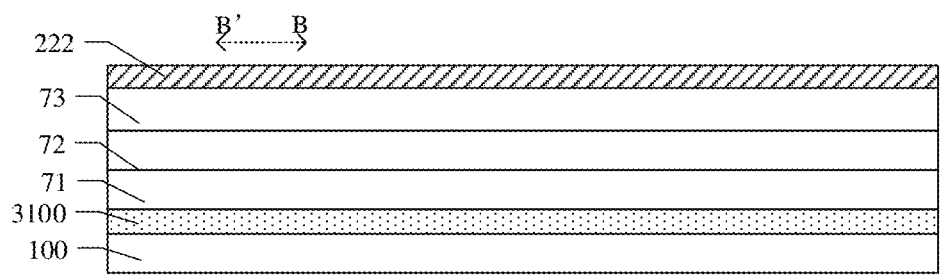
FIG. 12 is a partial cross-sectional structural schematic diagram of the pixel circuit shown in FIG. 11 taken along BB'.

FIG. 12 is a partial cross-sectional structural schematic diagram of the pixel circuit shown in FIG. 11 taken along BB'. As shown in FIG. 11 and FIG. 12, the gate insulating layer 71, the first insulating layer 72, and the second insulating layer 73 provided between the second sub-data line 222 and the second electrode of the data writing transistor T2 in the third pixel circuit are not provided with via holes, so that the second sub-data line 222 is insulated from the second electrode of the data writing transistor T2 located directly under it.

Thus, an insulating layer (including the gate insulating layer, the first insulating layer, and the second insulating layer) is provided between a film layer where the first electrode of the data writing transistor is located and a film layer where the data line is located; first electrodes of data writing transistors in the first pixel circuit and the second pixel circuit are connected with the data line through via holes located in the insulating layer; and first electrodes of data writing transistors in at least part of the third pixel circuits overlapping with the second data line are insulated from the second data line by the insulating layer.

For example, at least one insulating layer between film layers where the third pixel circuit and the second data line are located may not be provided with any via hole in a corresponding region of the third pixel circuit. For example, all insulating layers between the third pixel circuit and the second data line may not be provided with any via hole in the corresponding region of the third pixel circuit.

Figure 13:
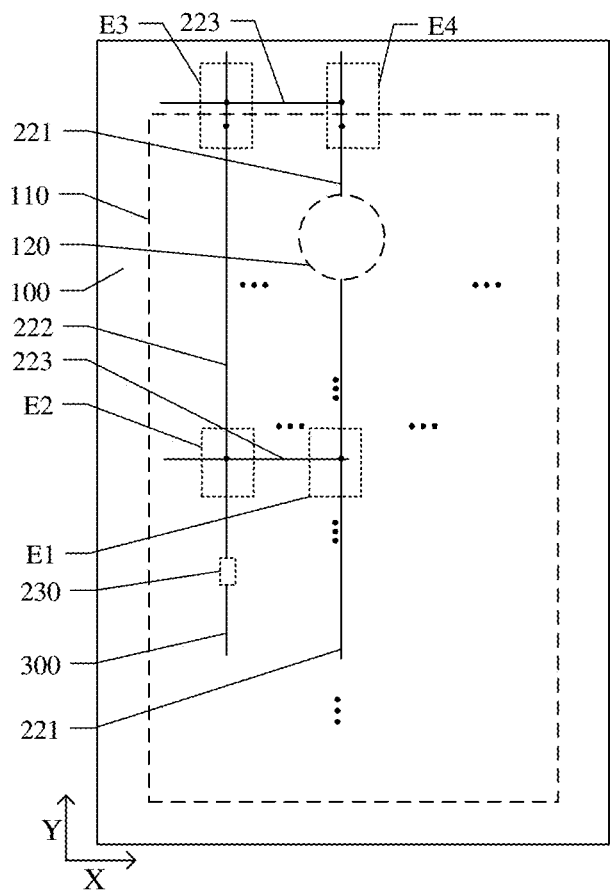
FIG. 13 is a schematic diagram of a display region and one second data line of the display substrate shown in FIG. 2.
Figure 14:
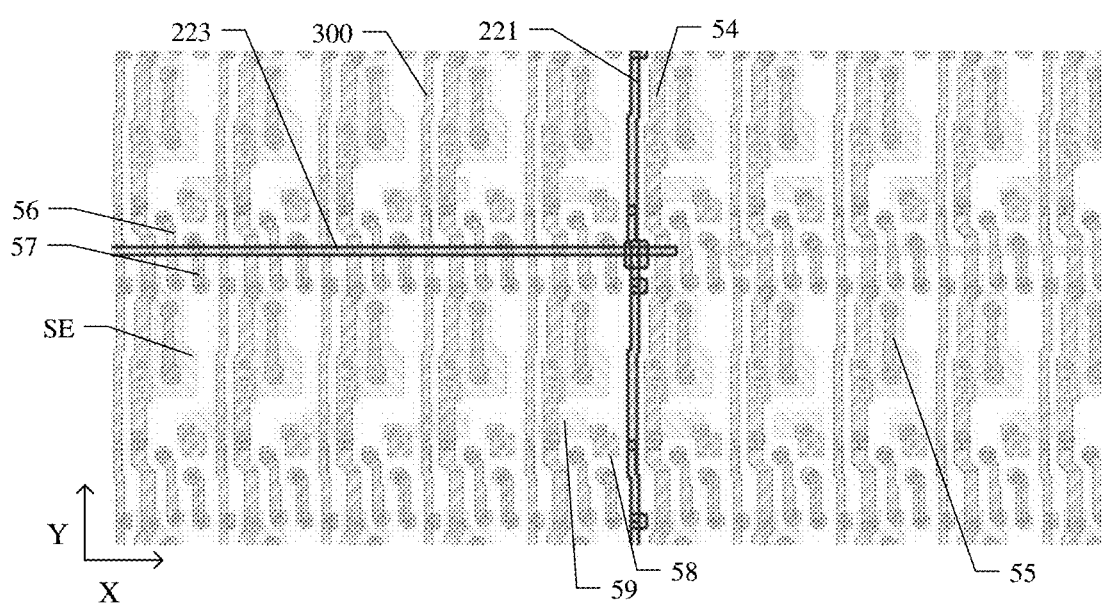
FIG. 14 is an enlarged view of region E1 shown in FIG. 13.
Figure 15:
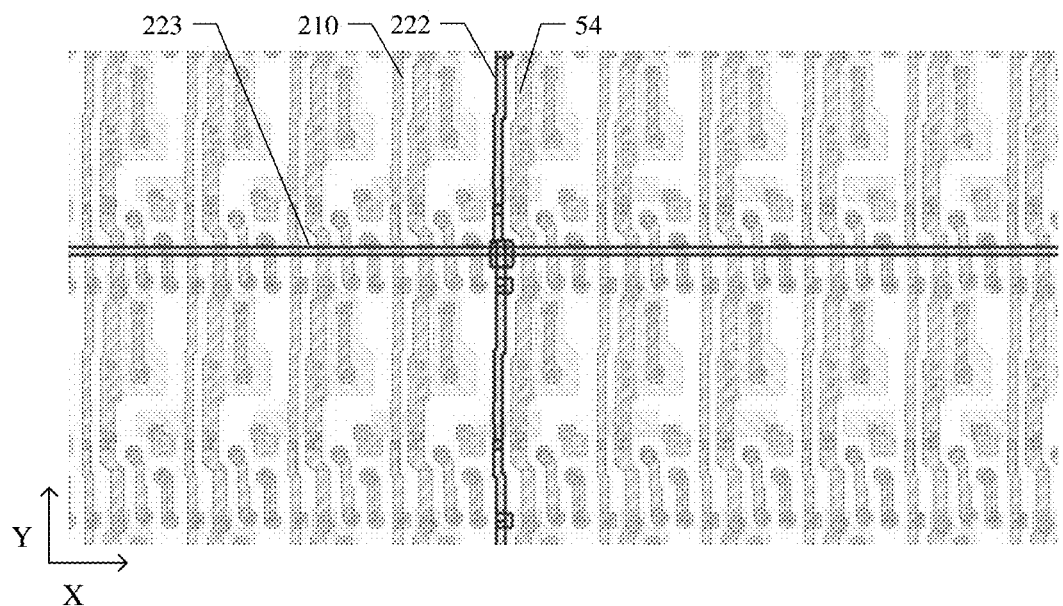
FIG. 15 is an enlarged view of region E2 shown in FIG. 13.
Figure 16:
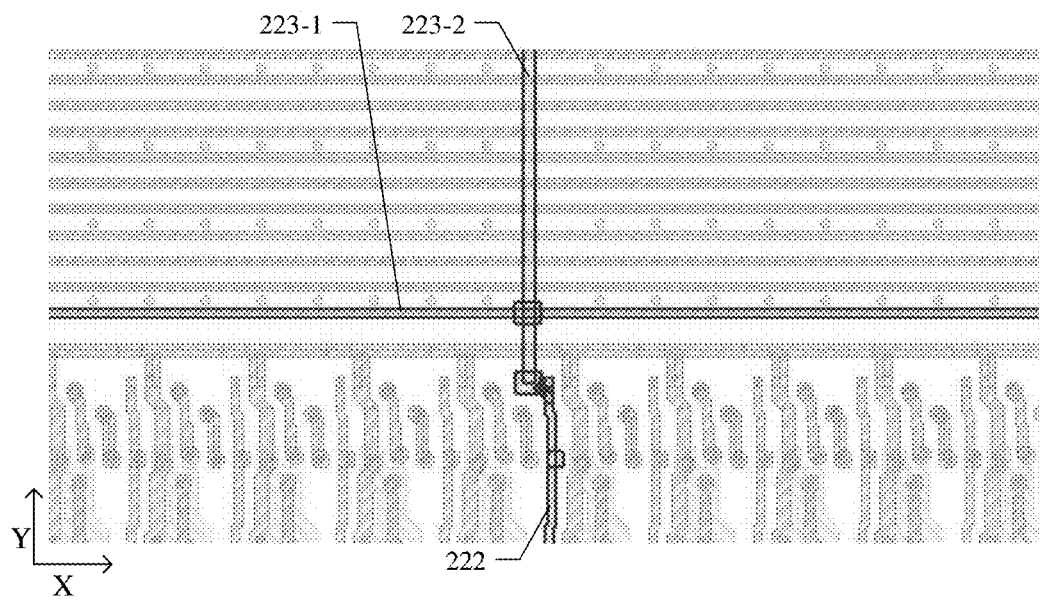
FIG. 16 is an enlarged view of region E3 shown in FIG. 13.
Figure 17:
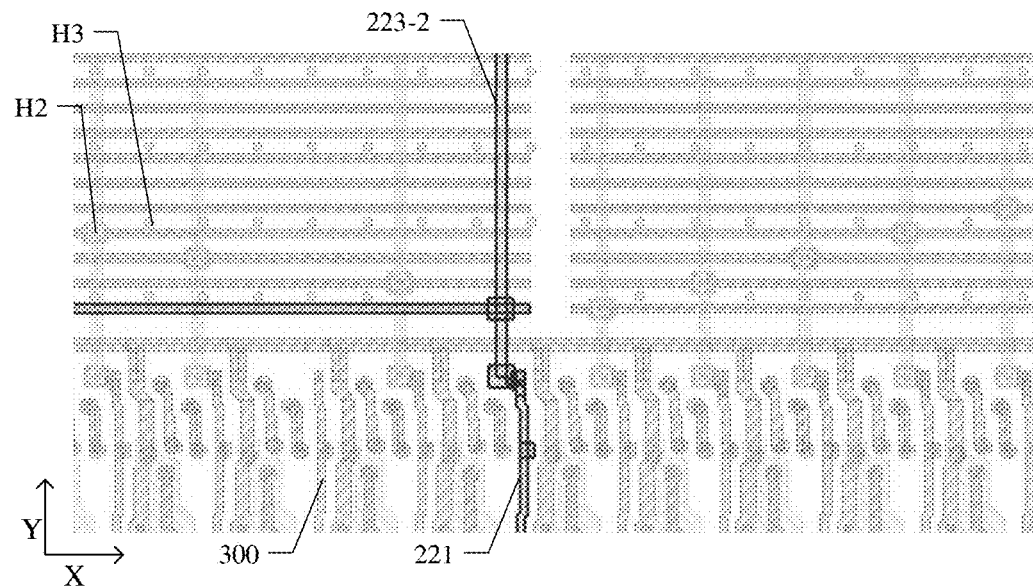
FIG. 17 is an enlarged view of region E4 shown in FIG. 13.

For example, FIG. 13 is a schematic diagram of a display region and one second data line of the display substrate shown in FIG. 2; FIG. 14 is an enlarged view of region E1 shown in FIG. 13; FIG. 15 is an enlarged view of region E2 shown in FIG. 13; FIG. 16 is an enlarged view of region E3 shown in FIG. 13; and FIG. 17 is an enlarged view of region E4 shown in FIG. 13. FIG. 14 to FIG. 16 schematically show planar schematic diagrams of a laminated structure of the source-drain metal layer and the third conductive layer. As shown in FIG. 13 to FIG. 16, the display substrate further includes a third conductive layer located on a side of the source-drain metal layer that is away from the base substrate; the third conductive layer includes an adapt line 223, a shielding electrode SE, and a fifth connecting portion 59 located in the display region, as well as a second adapt line 223-2 located outside the display region.

For example, the shielding electrode SE is connected with the power signal line 54, so that a voltage on the shielding electrode SE is stable, which may play a shielding role and prevent the transparent wiring connecting the second light-emitting element and the second pixel circuit from affecting potential of the gate electrode of the drive transistor and the first connecting portion. An orthographic projection of the first connecting portion on the base substrate falls within an orthographic projection of the shielding electrode SE on the base substrate.

For example, as shown in FIG. 13 to FIG. 17, a third insulating layer may be provided between the third conductive layer and the source-drain metal layer; and the fifth connecting portion 59 may be connected with the fourth connecting portion 58 through a via hole in the third insulating layer to implement connection with the second electrode of the first light-emitting control transistor T6.

For example, each light-emitting element includes a first electrode, a light-emitting layer, and a second electrode (none of which are shown) that are stacked; the first electrode of the light-emitting element is located on a side of the light-emitting layer that faces the base substrate; and the first electrode of the light-emitting element is connected with the second electrode of the first light-emitting control transistor T6 through the fifth connecting portion and the fourth connecting portion.

For example, as shown in FIG. 14 and FIG. 15, the adapt line 223 connected with one first sub-data line 221 may overlap with the second connecting portion 56 and the third connecting portion 57. For example, in the direction perpendicular to the base substrate, the adapt line 223 may overlap with the reset control signal line.

For example, as shown in FIG. 16 and FIG. 17, the first adapt line 223-1 may be formed by patterning the source-drain metal layer to save the number of film layers; the second adapt line 223-2 may be formed by patterning the third conductive layer; and the second adapt line 223-2 is respectively connected with the first sub-data line 221 and the first adapt line 223-1 through two via holes H2 in the third insulating layer. The embodiment of the present disclosure is not limited thereto, the second adapt line and the first sub-data line (or the second sub-data line) may be arranged in the same layer and be the same signal line; and the first adapt line and the first sub-data line are arranged in different layers.

For example, as shown in FIG. 16 and FIG. 17, the third insulating layer further includes a plurality of via holes H3, so that the third insulating layer is etched more uniformly.

Figure 18:
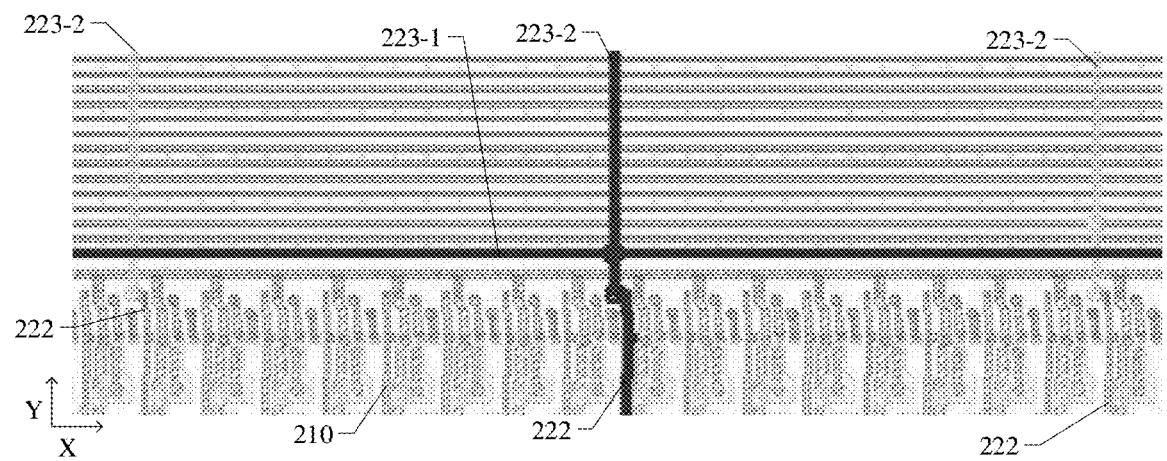
FIG. 18 is a partial structure including the partially enlarged view shown in FIG. 16.
Figure 19:
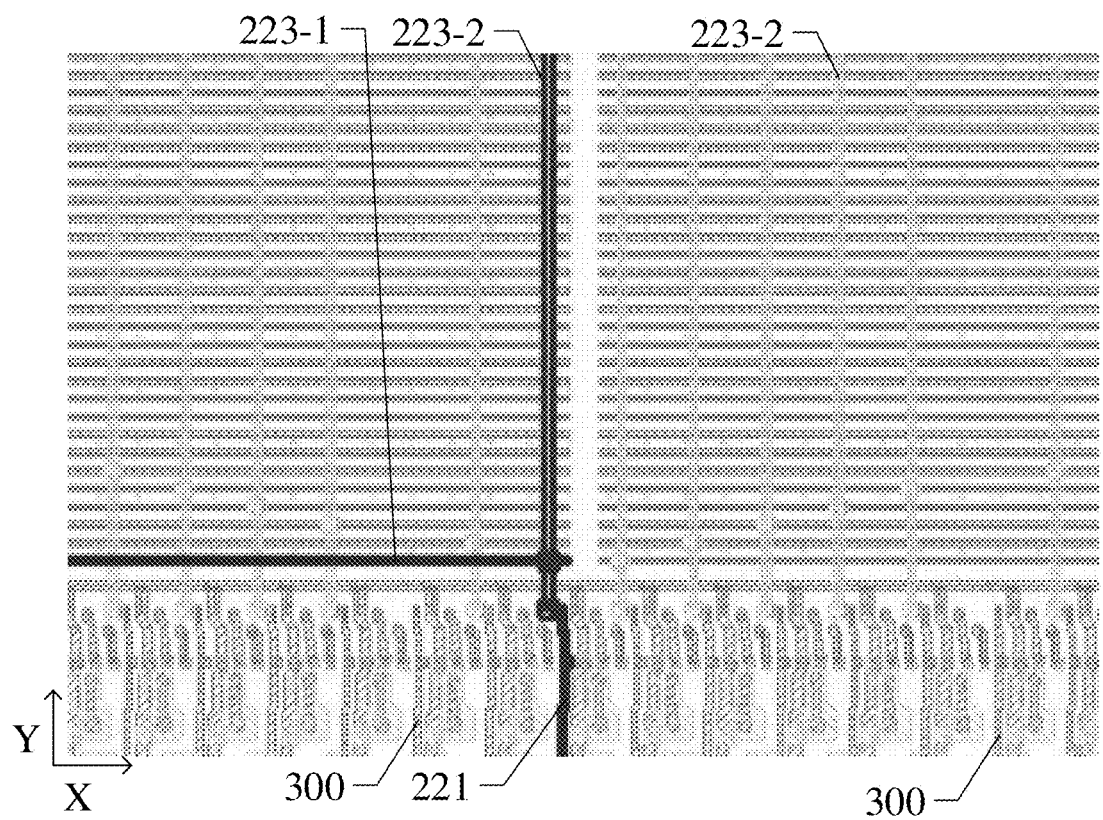
FIG. 19 is a partial structure including the partially enlarged view shown in FIG. 17.

For example, FIG. 18 is a partial structure including the partially enlarged view shown in FIG. 16; and FIG. 19 is a partial structure including the partially enlarged view shown in FIG. 17. For example, as shown in FIG. 16 to FIG. 19, seven first data lines 210 may be provided between two adjacent second sub-data lines 222, and seven first sub-data lines 221 may be provided between two adjacent wirings 300. For example, the first sub-data lines 221 located on an upper side of the second display region are all connected with the second sub-data lines 222 located on left and right sides of the second display region through the first adapt line 223-1 and the second adapt line 223-2.

At least one embodiment of the present disclosure provides a display substrate; as shown in FIG. 2 to FIG. 19, the display substrate includes a base substrate 100, a plurality of pixel circuits 1000 and a plurality of data lines 200 located on the base substrate 100. The plurality of pixel circuits 1000 include a plurality of first-type pixel circuits 1001 and a plurality of second-type pixel circuits 1002; the first-type pixel circuits 1001 are electrically connected with the data line 200; and the second-type pixel circuits 1002 are insulated from the data line 200. In the display substrate provided by the embodiment of the present disclosure, by insulating the second-type pixel circuits from the data line, the number of pixel circuits connected with the data line may be reduced to reduce data loading, thereby alleviating the phenomenon of dark vertical stripes in the display region and improving display quality of the display substrate.

For example, as shown in FIG. 2 to FIG. 19, the first-type pixel circuits 1001 are electrically connected with the data line 200 overlapping therewith; and the second-type pixel circuits 1002 are insulated from the data line 200 overlapping therewith.

For example, as shown in FIG. 2 to FIG. 19, at least part of the first-type pixel circuits 1001 are configured to drive a light-emitting element (e.g., the first light-emitting element 111 or the second light-emitting element 121) connected therewith to emit light; the second-type pixel circuit 1002 is a first dummy pixel circuit. The first dummy pixel circuit is a pixel circuit not connected with any light-emitting element.

For example, as shown in FIG. 2 to FIG. 19, the first-type pixel circuits 1001 include a first pixel circuit 112 and a second pixel circuit 113; the first pixel circuit 112 overlaps with the light-emitting element (the first light-emitting element 111) connected therewith in the direction perpendicular to the base substrate 100; the second pixel circuit 113 does not overlap with the light-emitting element (the second light-emitting element 121) connected therewith in the direction perpendicular to the base substrate 100; and the first-type pixel circuits 1001 also include a second dummy pixel circuit 1003. The second dummy pixel circuit 1003 is a pixel circuit not connected with any light-emitting element.

For example, as shown in FIG. 2 to FIG. 19, the second-type pixel circuits 1002 and part of the first-type pixel circuits 1002 are located in the same column.

For example, as shown in FIG. 2 to FIG. 19, the second-type pixel circuits 1002 and the second pixel circuit 113 are located in the same column.

For example, as shown in FIG. 2 to FIG. 19, the pixel circuit 1000 includes a data writing transistor T4; the data writing transistor T4 includes a first electrode, a second electrode, and a gate electrode; and an insulating layer is provided between a film layer where the first electrode of the data writing transistor T4 is located and a film layer where the data line 200 is located; the first electrode of the data writing transistor T4 of the first-type pixel circuit 1001 is connected with the corresponding data line 200 through a via hole H1 located in the insulating layer (e.g., the gate insulating layer 71, the first insulating layer 72 and the second insulating layer 73); and the first electrode of the data writing transistor T4 of the second-type pixel circuit 1002 is insulated from the data line 200 by the insulating layer (e.g., the gate insulating layer 71, the first insulating layer 72, and the second insulating layer 73).

The first-type of pixel circuits according to this embodiment include the first pixel circuit, the second pixel circuit, and part of the third pixel circuits (the third pixel circuits connected with the wiring) according to the above-described embodiment; and the second-type pixel circuits include the other part of third pixel circuits (the pixel circuits not connected with the wiring or the data line). The structures such as the base substrate, the data lines, the pixel circuits, and the light-emitting elements according to the embodiment of the present disclosure have same features as the structures of the base substrate, the data lines, the pixel circuits, and the light-emitting elements according to the above-described embodiment, and no details will be repeated here.

Another embodiment of the present disclosure provides a display apparatus including any one of the above-described display substrates.

For example, the display apparatus provided by the embodiment of the present disclosure may be an organic light-emitting diode display apparatus.

For example, in the display apparatus provided by the embodiment of the present disclosure, by setting at least part of third pixel circuits overlapping with the second data line to be disconnected from the second data line, the number of pixel circuits connected with the second data line may be reduced, to reduce data loading, so as to alleviate the phenomenon of dark vertical stripes in the second display region, and improve display quality of the display apparatus.

For example, the display apparatus may further include a cover plate located on a display side of the display substrate. For example, the display apparatus may further include a functional component located on a side of the base substrate that is away from the light-emitting element, and the functional component directly faces the second display region.

For example, functional components include at least one of a camera module (e.g., a front camera module), a 3D structured light module (e.g., a 3D structured light sensor), a time of flight 3D imaging module (e.g., a time of flight sensor), and an infrared sensing module (e.g., an infrared sensing sensor), etc.

For example, the front camera module is usually activated when a user takes a selfie or a video call, and a pixel display region of the display apparatus displays an image obtained by the selfie for the user to watch. The front camera module includes, for example, a lens, an image sensor, an image processing chip, etc. An optical image of a scene generated by the lens is projected onto a surface of the image sensor (the image sensor includes CCD and CMOS) and converted into an electrical signal, which is converted into a digital image signal through analog-to-digital conversion by the image processing chip, and then sent to the processor for processing; and the image of the scene is output on the display.

For example, the 3D structured light sensor and the Time of Flight (ToF) sensor may be used for face recognition to unlock the display apparatus, and so on.

For example, the functional component 20 may only include a camera module to implement a function of selfie or video call; for example, the functional component 20 may further include a 3D structured light module or a time of flight 3D imaging module to implement face recognition and unlocking, etc.; and this embodiment includes but is not limited thereto.

For example, the display apparatus may be a mobile phone, a tablet personal computer, a laptop, a navigator having a full display camera, and any other product or component having a display function; and this embodiment is not limited thereto.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, and the protection scope of the present disclosure is not limited thereto. Therefore, the protection scope of the present disclosure should be determined based on the protection scope of the claims.

What is claimed is:

1. A display substrate, comprising:
a base substrate, comprising a first display region and a second display region, wherein
the first display region is located at a periphery of the second display region;
the first display region comprises a plurality of first light-emitting elements, a plurality of first pixel circuits, a plurality of second pixel circuits, and a plurality of third pixel circuits;
the plurality of first pixel circuits are connected with the plurality of first light-emitting elements in one-to-one correspondence; the second display region comprises a plurality of second light-emitting elements; the plurality of second pixel circuits are connected with the plurality of second light-emitting elements in one-to-one correspondence; the third pixel circuit is a dummy pixel circuit;
a plurality of data lines, located on the base substrate and not passing through the second display region, wherein, the plurality of data lines comprise a plurality of first data lines and a plurality of second data lines, respective first data lines are configured to be connected with the first pixel circuits, and respective second data lines are configured to be connected with at least the second pixel circuits;
wherein, in a direction perpendicular to the base substrate, part of the plurality of third pixel circuits overlap with the plurality of second data lines, and at least part of the third pixel circuits overlapping with the second data lines are insulated from the second data lines;
wherein the respective first data lines extend along a first direction; the first data line of which an extension line does not pass through the second display region among the plurality of first data lines is configured to transmit a data signal to M first pixel circuits, the respective second data lines are configured to transmit signals to N pixel circuits, M>N, and the N pixel circuits at least comprise the second pixel circuit;
wherein the second data line comprises a first sub-data line and a second sub-data line extending along the first direction, and an adapt line connecting the first sub-data line and the second sub-data line;
the first sub-data line, the second sub-data line, and the first data line are arranged in a same layer;
the first sub-data line is configured to be connected with the first pixel circuit; and
the second sub-data line is configured to be connected with the second pixel circuit.

2. The display substrate according to claim 1, wherein respective third pixel circuits overlapping with the second data line are insulated from the second data lines.

3. The display substrate according to claim 1, further comprising: a plurality of wirings, extending along the first direction and not passing through the second display region, wherein the plurality of wirings and the plurality of first data lines are arranged in a same layer, and at least one data line is arranged between two adjacent wirings; and in the direction perpendicular to the base substrate, the wiring only overlaps with the third pixel circuit.

4. The display substrate according to claim 3, wherein the plurality of wirings comprise a plurality of first wirings; the number of first wirings is equal to the number of second sub-data lines; and one of the first wirings and at least a portion of one second sub-data line are substantially located on a same straight line with space provided between them;
the display substrate further comprises an adapt region, comprising the plurality of adapt lines,
the adapt region comprises a first adapt region located on one side of the second display region in the first direction, the adapt line in the first adapt region extends along a second direction intersecting with the first direction and is located in a different layer from the first data line; the space is located on a side of the first adapt region away from the second display region; and the first wiring overlaps with at least part of the third pixel circuits.

5. The display substrate according to claim 4, wherein the first wiring and the second sub-data line are configured to transmit different electrical signals.

6. The display substrate according to claim 4, wherein the adapt region further comprises a second adapt region located on the other side of the second display region in the first direction; and the second adapt region is located in a non-display region other than the first display region and the second display region.

7. The display substrate according to claim 6, wherein each of the adapt lines in the second adapt region comprises a first adapt line and a second adapt line that are connected with each other and arranged in different layers; and one of the first adapt line and the second adapt line is connected with the second sub-data line and is located in a different layer from the second sub-data line.

8. The display substrate according to claim 1, wherein, in the second data line, two first sub-data lines are connected with a same second sub-data line; the two first sub-data lines are respectively located on both sides of the second display region in the first direction; and at least portions of the two first sub-data lines are substantially located on a same straight line.

9. The display substrate according to claim 3, wherein one of the second sub-data lines extends along the first direction, and an orthographic projection of the one of the second sub-data lines overlaps with an orthographic projection of one of the wirings on a straight line extending along the first direction.

10. The display substrate according to claim 9, wherein the adapt line is located in a non-display region other than the first display region and the second display region.

11. The display substrate according to claim 10, wherein each adapt line comprises a first adapt line and a second adapt line that are connected with each other and arranged in different layers; and one of the first adapt line and the second adapt line is connected with the second sub-data line and is located in a different layer from the second sub-data line.

12. The display substrate according to claim 10, wherein a length of the second sub-data line is not less than a length of the first data line of which an extension line does not pass through the second display region among the plurality of first data lines.

13. The display substrate according to claim 9, wherein one first sub-data line and one first data line are respectively located on both sides of the second display region in the first direction, and are substantially located on a same straight line; and the respective first sub-data lines and the first data lines located substantially on the same straight line are configured to transmit a same data signal.

14. A display apparatus, comprising the display substrate according to claim 1.

* * * * *